(12) United States Patent
Iyer et al.

(10) Patent No.: US 7,488,690 B2
(45) Date of Patent: Feb. 10, 2009

(54) SILICON NITRIDE FILM WITH STRESS CONTROL

(75) Inventors: R. Suryanarayanan Iyer, Santa Clara, CA (US); Andrew M. Lam, San Francisco, CA (US); Yuji Maeda, Chiba (JP); Thomas Mele, Livermore, CA (US); Jacob W. Smith, Santa Clara, CA (US); Sean M. Seutter, San Jose, CA (US); Sanjeev Tandon, Sunnyvale, CA (US); Randhir P. Singh Thakur, San Jose, CA (US); Sunderraj Thirupapuliyur, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 151 days.

(21) Appl. No.: 10/885,969

(22) Filed: Jul. 6, 2004

(65) Prior Publication Data
US 2006/0009041 A1    Jan. 12, 2006

(51) Int. Cl.
*H01L 21/302* (2006.01)
*H01L 21/461* (2006.01)
*H01L 21/425* (2006.01)
*H01L 21/336* (2006.01)

(52) U.S. Cl. .............. 438/724; 438/257; 438/710; 438/514

(58) Field of Classification Search .......... 438/724, 438/710, 637, 514, 737, 257
See application file for complete search history.

(56) References Cited

U.S. PATENT DOCUMENTS

| | | | |
|---|---|---|---|
| 5,116,643 A * | 5/1992 | Miller et al. | 427/126.3 |
| 6,091,121 A * | 7/2000 | Oda | 257/408 |
| 6,261,891 B1 * | 7/2001 | Cheng et al. | 438/238 |
| 6,323,519 B1 | 11/2001 | Gardner et al. | |
| 6,455,871 B1 * | 9/2002 | Shim et al. | 257/12 |
| 6,500,772 B2 | 12/2002 | Chakravarti et al. | |
| 6,515,350 B1 * | 2/2003 | Moore | 257/640 |
| 6,850,250 B2 | 2/2005 | Hoch | |
| 6,864,126 B2 * | 3/2005 | Kim | 438/142 |
| 7,138,340 B2 * | 11/2006 | Lee et al. | 438/737 |
| 2002/0081811 A1 | 6/2002 | Foglietti et al. | |

(Continued)

FOREIGN PATENT DOCUMENTS

CN    1505839 A    6/2004

OTHER PUBLICATIONS

Chan, V., et al. "High Speed 45nm Gate Length CMOSFETs Integrated Into a 90 nm Bulk Technology Incorporating Strain Engineering," IEEE, 2003, 4 pages.

(Continued)

*Primary Examiner*—Chuong A. Luu
(74) *Attorney, Agent, or Firm*—Blakely Sokoloff Taylor & Zafman

(57) ABSTRACT

An assembly comprises a multilayer nitride stack having nitride etch stop layers formed on top of one another, each of the nitride etch stop layers is formed using a film forming process. A method of making the multilayer nitride stack includes placing a substrate in a single wafer deposition chamber and thermally shocking the substrate momentarily prior to deposition. A first nitride etch stop layer is deposited over the substrate. A second nitride etch stop layer is deposited over the first nitride etch stop layer.

30 Claims, 13 Drawing Sheets

U.S. PATENT DOCUMENTS

| | | |
|---|---|---|
| 2002/0090835 A1 | 7/2002 | Chakravarti et al. |
| 2002/0111039 A1 | 8/2002 | Moore |
| 2002/0140100 A1 | 10/2002 | Yokoyama |
| 2003/0030106 A1 | 2/2003 | Mandelman et al. |
| 2003/0141536 A1 | 7/2003 | Weimer |
| 2003/0211681 A1 | 11/2003 | Hanafi et al. |

OTHER PUBLICATIONS

Ghani T, et al., "A 90 nm High Volume Manufacturing Logic Technology Featuring Novel 45nm Gate Length Strained Silicon CMOS Transistors," Proceedings of the 2003 International Electron Devices Meeting, IEEE, 2003, 3 pages.

Ito, S., et al., "Mechanical Stress Effect of Etch-Stop Nitride and its Impact on Deep Submicron Transistor Design," NEC Corporation, ULSI Device Development Division, Berkeley Seminar, IEEE, 2004, 4 pages.

Ootsuka, F., et al, "A Highly Dense, High-Performance 130nm node CMOS Technology For Large Scale System-On-A-Chip Applications," Hitachi Japan, Device Development Center, IEEE, 2000, 4 pages.

Ota, K., et al., "Novel Locally Strained Channel Technique For High Performance 55nm CMOS," IEEE, 2002, Presented at The 3rd Kansai Colloquium Electron Devices Workshop, Feb. 25, 2003, 4 pages.

Seutter, S., et al., "Production of Silicon Oxide-Nitride Films with an Integrated 300nm Single-Wafer System for Sub 90nm Front-End-Of-Line Space Application," SEMICON® China 2004 SEMI Technology Symposium, 4 pages.

Shimizu, A., et al., "Local Mechanical-Stress Control (LMC): A New Technique For CMOS-Performance Enhancement," IEEE, 2001, 4 pages.

Smith, J., et al., "Thermal Chemical Vapor Deposition of Bis (Tertiary-Butylamino) Silane-based Silicon Nitride Thin Films: Equipment Design and Process Optimization for sub-90nm Front-End-of-Line Applications," Applied Materials, Inc., 7 pages.

PCT/US2005/023933, Jul. 11, 2005, International Search Report.

PCT/US2005/023933, Feb. 9, 2006, Copy of International Application.

PCT/US2005/023933, Jan. 18, 2007, Preliminary Report on Patentability.

Thompson, S.E. et al. "A Logic Nanotechnology Featuring Strained-Silicon" IEEE Electron Device Letters, IEEE Service Center, New York, NY, vol. 25, No. 4, Apr. 2004, pp. 191-193, XP001190370.

Iyer, S. et al. "Holy Grail for 65nm and 45nm spacer: Options, Current Status and Chance of Success", Engineering & Technology Conference 2003.

* cited by examiner

SILICON NITRIDE FILM WITH STRESS CONTROL

FIELD

The embodiments of the invention pertain to methods of forming a nitride etch stop film and a multilayer nitride etch stop stack to mechanically create a controlled stress (tensile or compressive) in a semiconductor device.

BACKGROUND

Today's integrated circuits include a vast number of transistor, capacitor, resistor, or other semiconductor devices formed in a semiconductor. Smaller devices are the key to enhance performance and to increase reliability in devices. As devices are scaled down, however, the technology becomes more complex and new methods are needed to maintain the expected performance enhancement from one generation of devices to the next. This relates mainly toward the primary semiconducting material of microelectronics, namely Silicon (Si), or more broadly, to Si based materials. One of the most important indicators of device performance is the carrier mobility. There is great difficulty in keeping carrier mobility high in devices of the deep submicron generations. A promising avenue toward better carrier mobility is to modify slightly the semiconductor that serves as raw material for device fabrication. It has been known, and recently further studied that Si, strained in tension, has intriguing carrier properties. Mechanical stress in the channel region markedly influences the performance and reliability of MOS devices. (See for example, Ito et al, "Mechanical stress effect of etch-stop nitride and its impact on deep submicron transistor design," NEC Corporation, IEDM 2000, San Francisco, Calif.). It has been known that a nitride etch stop film causes tensile stress in the Si substrate. Thus, there has been a lot of interest in high-stress nitride etch stop film in the fabrication of MOS devices.

Tensile stress may be obtained by forming a nitride etch stop to create stress (that translates to strain in the underlying silicon) in the channel of a MOS device. Device mobility has been extensively studied by introducing strain in the channel. One such technique is the use of contact etch stop nitride layer as a stressor. To achieve increased drive current via increased carrier mobility and velocity, thicker nitride layers may be used to meet higher, specified stress levels.

SUMMARY

One aspect of the invention pertains to an assembly comprising a multilayer nitride stack having nitride etch stop layers formed on top of one another, each of the nitride etch stop layers is formed using a film forming process.

Another aspect of the invention pertains to a method of making a multilayer nitride stack, which includes placing a substrate in a single wafer deposition chamber and thermally shocking the substrate momentarily prior to deposition. A first nitride etch stop layer is deposited over the substrate. A second nitride etch stop layer is deposited over the first nitride etch stop layer.

Another aspect of the invention pertains to a method of making a nitride etch stop layer, which includes placing a substrate in a single wafer deposition chamber and thermally shocking the substrate momentarily prior to deposition. The nitride etch stop layer is deposited over the substrate.

Another aspect of the invention pertains to a method of making a nitride spacer on a substrate, followed by a nitride etch stop layer or a multilayer nitride etch stop stack formation. The nitride spacer layer is formed or deposited over the underlying film (on the substrate). In one aspect, the substrate is thermally shocked prior to the formation or deposition of the nitride spacer. In another aspect, a nitride etch stop layer is formed over the nitride spacer and over the substrate. In one aspect, the substrate is thermally shocked prior to the formation of the nitride etch stop layer. In another aspect, a multilayer nitride etch stop stack comprising at least two layers of nitride etch stop is formed over the nitride spacer and over the substrate. In one aspect, the substrate is thermally shocked prior to the formation of at least one layer of the multilayer nitride etch stop stack or all of the layers of the multilayer nitride etch stop stack.

BRIEF DESCRIPTION OF THE DRAWINGS

The embodiments of the invention are illustrated by way of example and not by way of limitation in the figures of the accompanying drawings in which like references indicate similar elements. The invention may best be understood by referring to the following description and accompanying drawings that are used to illustrate embodiments of the invention. It should be noted that references to "an" embodiment of the invention in this disclosure are not necessarily to the same embodiment, and they mean at least one. In the drawings.

DETAILED DESCRIPTION

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

Exemplary embodiments of the present invention pertain to techniques for forming a multilayer nitride etch stop film to mechanically create a controlled stress (tensile or compressive) in a semiconductor device such as a channel of a metal oxide semiconductor (MOS) transistor structure. Exemplary embodiments of the present invention also pertain to novel techniques for forming a nitride etch stop film to mechanically create a controlled stress (tensile or compressive) in a similar semiconductor device.

Figure 1A:
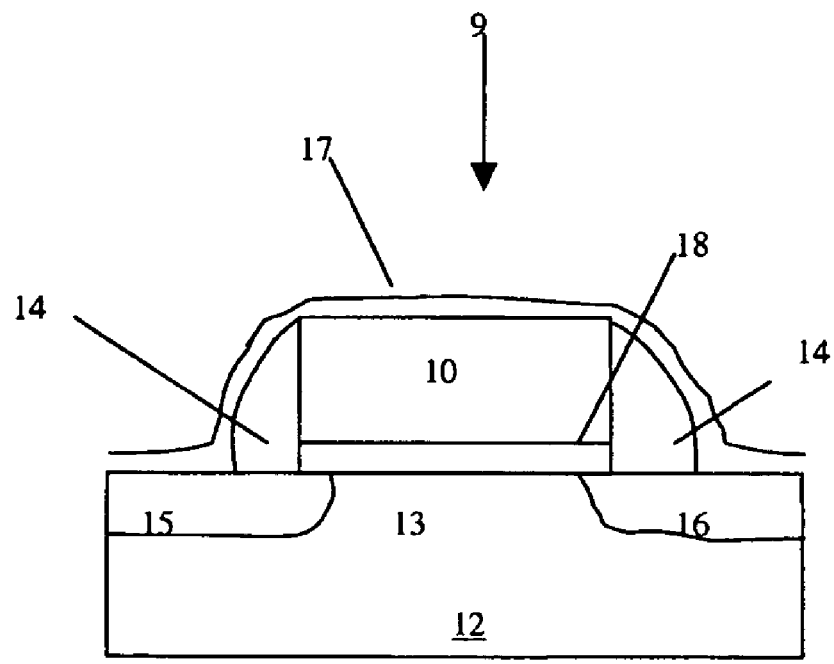
FIG. 1A illustrates an exemplary embodiment of a device that incorporates a nitride etch stop layer.

FIG. 1A illustrates an exemplary semiconductor device 9 (e.g., a MOS transistor). FIG. 1A illustrates a nitride etch stop layer acting as a tensile stress inducing layer being incorporated into the semiconductor device 9 to create tensile stress in the device 9. The device 9 includes a substrate 12 having a source 15 and a drain 16 regions created therein. The substrate 12 is implanted to create the source region 15 and the drain region 16 as is known in the art. The device 9 includes a gate electrode 10 that is separated from a channel region 13 in the substrate 12 by a thin gate dielectric layer 18 such as silicon oxide, nitrided silicon oxide, oxide-nitride-oxide, or a high-K dielectric. The gate electrode 10 is typically formed of a doped semiconductor material such as polysilicon to minimize resistance of the gate electrode 10. The material of the gate electrode 10 may also be metal. The gate electrode 10 and the dielectric layer 18 are formed approximately between the source and drain regions 15 and 16. Methods of creating gate electrode 10 and the dielectric layer 18 are known in the art. A nitride etch stop layer 17 formed using embodiments discussed below is deposited over the substrate 12 covering the source and drain regions 15 and 16 and the gate electrode 10.

The source 15 and the drain 16 regions are formed on opposing sides of the gate electrode 10 and the gate dielectric layer 18. Silicide may be formed (not shown) on the gate electrode 10, the source 15 and the drain 16 regions to improve contact by reducing resistance to the gate electrode and the source/drain regions. Silicide may be formed of a metal material such as cobalt or nickel. In the embodiments where a Silicide film is included, the nitride etch stop layer 17 is formed over the Silicide layer and over the substrate 12 that includes all the structures previously discussed.

In one embodiment, the device 9 includes spacers 14 formed on each side of the gate electrode 10. In certain embodiments, such as a polycide fabrication process, the spacers 14 are used to protect the gate stack (the gate dielectric and the gate electrode) from being shorted to the source and/or drain metal contacts during manufacture. However, an embodiment without the spacers may also work. When the spacers 14 are included, the nitride etch stop layer 17 formed over the substrate 12 also covers the spacers 14.

In some embodiments, vias are created in the nitride etch stop layer 17 to allow for contacts to the gate electrode 10, the source region 15, and the drain region 16. Conductive traces (e.g., metalization) (not shown) can be formed on top of nitride etch stop layer 17 and into the vias to reach the source, drain, and gate regions.

A nitride etch stop layer 17 is conformably formed over the substrate 12 covering the source region 15, the drain region 16, the gate dielectric layer 18, the gate electrode 10, and the spacers 14. In one embodiment, the nitride etch stop layer 17 acts as a tensile stress inducing layer to introduce a tensile stress or equivalent strain into the silicon channel 12. The tensile stress enhances electron mobility and in turn increases drive current and circuit performance.

Figure 1B:
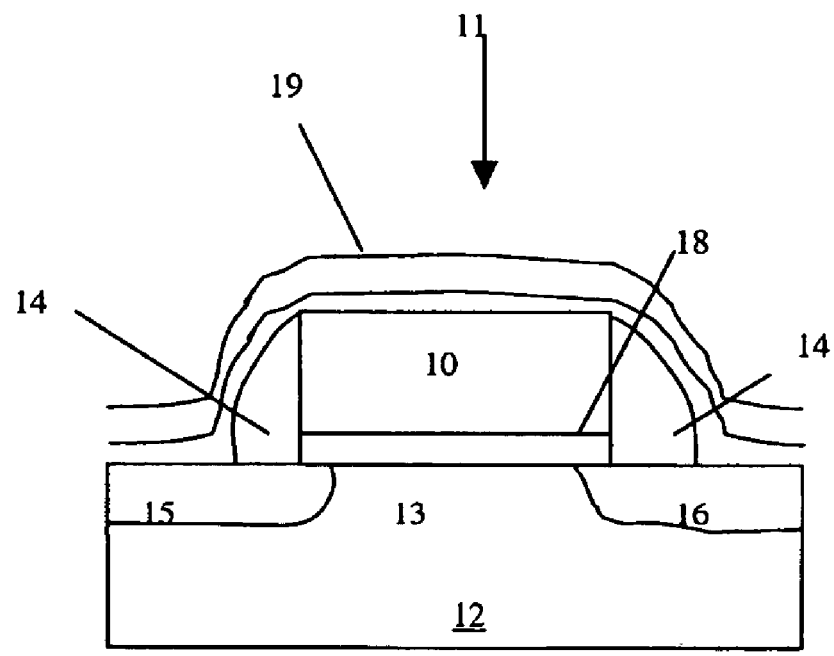
FIG. 1B illustrates an exemplary embodiment of a device that incorporates a multilayer nitride stack.

In one embodiment, the nitride etch stop layer 17 has a thickness of about 200-1000 angstroms and an intrinsic film stress of about 1-2 Giga Pascal (GPa). The nitride etch stop layer 17 induces a tensile stress into the substrate 12 and in one embodiment, in the channel region 13 (FIGS. 1A-1B). In one embodiment, the nitride etch stop layer 17 induces a tensile stress ranging from about 150-450 Mega Pascal (MPa) in the channel region 13 or in the substrate 12.

In one embodiment, the substrate 12 is semiconductor substrate typically used to form semiconductor devices such as transistors, capacitors, and resistors. The substrate 12 can also include monocrystalline silicon, polycrystalline silicon, silicon-on-insulator, silicon on silicon-germanium, or other suitable semiconductor substrates known in the art.

In one embodiment, the nitride etch stop layer 17 is formed in a single wafer deposition chamber (see below) wherein the substrate 12 is subjected to a thermal shock prior to the deposition of the nitride etch stop layer 17. Thermal shocking the substrate indicates that the subject is brought to a process temperature quickly just immediately or momentarily prior to the deposition of the nitride etch stop layer. The substrate is thus not equilibrated or stabilized to the process temperature for a period of time (pre-heat) prior to the deposition. In one embodiment, the substrate 12 comprises the gate stack (the gate dielectric layer 18 and the gate electrode 10), the source and drain regions 15 and 16, and the spacers 14 formed using conventional methods. The nitride etch stop layer 17 is formed as a conformal film over the substrate 12 as is shown in FIG. 1A. The substrate 12 is placed in the single wafer deposition chamber. The chamber may be set to a desired process temperature and process pressure. The substrate 12 is first kept cool, for example, by not contacting the heater of the deposition chamber. The substrate 12 is only brought to the process temperature just immediately prior to the deposition of the nitride etch stop layer 17. The substrate 12 is thus not preheated or stabilized to the process temperature prior to the deposition of the nitride etch stop layer 17. In one embodiment, thermally shocking the substrate 12 results in about 5-15% gain in tensile stress, both in the intrinsic stress in the nitride etch stop layer 17 itself and in the channel region 13 or the substrate 12. Thermally shocking the substrate 12 prior to depositing the nitride etch stop layer 17 thus results in better intrinsic stress in the film and tensile stress in the channel region than conventional methods of forming the nitride etch stop layer.

The process temperature is chosen according to an optimal range for a particular precursor agent (e.g., optimal for a particular silicon source gas and nitridation source gas). In one embodiment, the process temperature ranges from about 550° C. to about 700° C. In another embodiment, the process temperature is about 675° C. In another embodiment, the process temperature is about 400° C. to about 700° C.

The process pressure can be a pressure that places the deposition chamber into a low-pressure deposition chamber, for instance, a pressure below 760 Torr. In one embodiment, the process pressure is about 50-500 Torr. In another embodiment, the process pressure is about 140 Torr.

The nitride etch stop layer 17 is deposited using a silicon source gas and a nitridation source gas as precursor agents. In one embodiment, the silicon source gas is bistertiarybutylamino silane (BTBAS) and the nitridation source gas is ammonia ($NH_3$). In another embodiment, the nitride etch stop layer 17 is deposited using other silicon source agent such as silane ($SiH_4$), disilane ($Si_2H_6$), dichlorosilane (DCS), hexachlorodisilane (HCD), silicon tetraiodide ($SiI_4$), silicon chloride ($SiCl_4$), tetrakis(dimethylamino)silane ($Si(NMe_2)_4$), bis(diethylamino)ethylsilane, tris(isopropylamino)silane, tris(dimethylamino)silane, mono-methyl hydrazine ($CH_3NHNH_2$) and hydrazino silanes (e.g., bis(dimethylhydrazino)methylsilane, tris(dimethylhydrazino)t-butylsilane, tris(dimethylhydrazino)ethylsilane, bis(dimethylhydrazino)ethylsilane, and tetrkis(dimethylhydrazino)silane. The nitridation source gas could also be hydrazine ($N_2H_4$). In one embodiment, the precursor agents include BTBAS and NH$_3$ at a ratio greater than 0 (NH$_3$:BTBAS) and less than 100.

In one embodiment, the process temperature for the BTBAS process ranges from about 550° C. to about 700° C. In another embodiment, the process temperature for the silane process ranges from about 550° C. to about 675° C. In yet another embodiment, the process temperature for the disilane process ranges from about 400° C. to about 700° C.

In one embodiment, the nitride etch stop layer 17 is formed using NH$_3$ and BTBAS with a ratio greater than 1 (NH$_3$: BTBAS), a process temperature of about 675° C. and a process pressure of about 140 Torr.

In some cases, such as in a complementary MOS process flow, a region of semiconductor material that will become the source and/or drain of a p-channel MOS (PMOS) transistor, in the same integrated circuit die or in the same semiconductor wafer for the NMOS structure, may be covered by a suitable layer prior to forming the tensile stress inducing layer. This layer is designed to help avoid inducing tensile stress in the channel of PMOS transistor structures via the tensile stress inducing layer, because tensile stress might not promote higher carrier mobility and velocity in such transistor structures.

FIG. 1B illustrates an alternative embodiment of inducing tensile stress in the channel region of a device similar to the device 9. A device 11 shown in FIG. 1B includes a substrate 12 having a source 15 and a drain 16 regions created therein. The device 11 includes a gate electrode 10 that is separated from a channel region 13 in the substrate 12 by a thin gate dielectric layer 18 such as silicon oxide, nitrided silicon oxide, oxide-nitride-oxide, or a high-K dielectric. The gate electrode 10 is typically formed of a doped semiconductor material such as polysilicon to minimize resistance of the gate electrode 10. The material of the gate electrode 10 may also be metal. The source 15 and the drain 16 regions are formed on opposing sides of the gate electrode 10. The gate electrode 10 and the gate dielectric layer 18 are typically referred to as a gate stack. Silicide may be formed (not shown) on the gate electrode 10, the source 15 and the drain 16 regions to improve contact by reducing resistance to the gate electrode and the source/drain regions. Silicide may be formed of a metal material such as cobalt or nickel. In one embodiment, the device 11 includes spacers 14 formed on each side of the gate electrode 10. In certain embodiments, such as a polycide fabrication process, the spacers 14 are used to protect the gate stack from being shorted to the source and/or drain metal contacts during manufacture. However, an embodiment without the spacers may also work.

The device 11 is similar to the device 9 but unlike the device 9 in FIG. 1A, the device 11 in FIG. 1B includes a multilayer nitride etch stop stack 19 having multiple nitride etch stop layers formed on top of one another. In one embodiment, the multilayer nitride etch stop stack 19 is a dual nitride etch stop stack having two nitride etch stop layers formed on top of each other. Each of the multiple nitride etch stop layers is formed using a separate film forming or deposition process. In one embodiment, the substrate 12 having structures formed thereon is placed in a deposition chamber. A first nitride etch stop layer is formed. The substrate 12 is then moved out of the deposition chamber. Alternatively, the substrate 12 is allowed to cool down prior to the deposition of a second nitride etch stop layer. A second nitride etch stop layer is then formed on top of the first nitride etch stop layer thus forming the multilayer nitride stack 19. Multiple layers of the etch stop nitride layer can be formed by repeating the process of depositing each layer. In one embodiment, each layer is formed after the substrate 12 is subjected to thermal shocking immediately prior to the deposition of each nitride etch stop layer. In one embodiment, each layer is formed by a separate film forming process, for example, the substrate 12 is moved out of the deposition chamber after each nitride etch stop layer is formed and moved back into the deposition chamber for the next nitride etch stop layer to be formed.

In one embodiment, each layer of the multilayer nitride etch stop stack 19 has a thickness substantially equal to each other. In one embodiment, the multilayer nitride etch stop stack 19 is a dual stack film having two nitride etch stop layers formed on top of one another. In this embodiment, each nitride etch stop layer is about 300 angstroms giving the multilayer nitride etch stop stack 19 a total thickness of about 600 angstroms. Of course the thickness of the multilayer nitride etch stop stack 19 can have other suitable thickness and number of layers depending on application, limitation, and/or configuration of the particular device that incorporate the multilayer nitride etch stop stack 19.

In one embodiment, each layer of the multilayer nitride etch stop stack 19 is formed in a single wafer deposition chamber (see below) wherein the substrate 12 is subjected to a thermal shock prior to the deposition of each layer of the multilayer nitride etch stop stack 19. In one embodiment, each layer of the multilayer nitride etch stop stack 19 is a nitride etch stop layer. In one embodiment, the substrate 12 comprises the gate stack (the gate dielectric layer 18 and the gate electrode 10), the source and drain regions 15 and 16, and the spacers 14 formed using conventional methods prior to the formation of the multilayer nitride etch stop stack 19. The multilayer nitride etch stop stack 19 forms a conformal film over the substrate 12 as is shown in FIG. 1B.

To form the multilayer nitride etch stop stack 19, the substrate 12 is placed in the single wafer deposition chamber. The chamber may be set to a desired process temperature and process pressure. The substrate 12 is first kept cool, for example, not contacting the heater of the deposition chamber. The substrate 12 is only brought to the process temperature just immediately prior to the deposition of layer of the multilayer nitride stack 19. The substrate 12 is thus not preheated or stabilized to the process temperature prior to the deposition of each layer of the multilayer nitride stack 19. The first layer of nitride etch stop is formed. The substrate 12 is then cooled or moved out of the chamber. The second layer of nitride etch stop is then formed in the chamber. The substrate 12 may be thermally shocked prior to the deposition of the second layer of nitride etch stop layer.

In one embodiment, forming the multilayer nitride stack 19 results in at least about 20% gain in the stress in the channel region 13. Additionally, thermally shocking the substrate 12 prior to the deposition of each layer in the multilayer nitride stack 19 results in about 5-10% gain in tensile stress, both in the intrinsic stress in the multilayer nitride etch stop stack 19 and in the channel region 13.

The process temperature is chosen according to an optimal range for a particular precursor agent (e.g., optimal for a particular silicon source gas and nitridation source gas). For each of the layer in the multilayer nitride etch stop stack 19, the process temperature ranges from about 550° C. to about 700° C. In one embodiment, the process temperature is about 675° C. In yet another embodiment, the process temperature from about 400° C. to about 700° C. The process pressure can be a pressure that put the deposition chamber into a low-pressure deposition chamber, for instance, a pressure below 760 Torr. In one embodiment, the process pressure is about 50-500 Torr. In another embodiment, the process pressure is about 140 Torr.

Each layer in the multilayer nitride stack 19 is deposited using a silicon source gas and a nitridation source gas as precursor agents. In one embodiment, the silicon source gas is BTBAS and the nitridation source gas is $NH_3$. In another embodiment, each layer of the nitride etch stop layer 19 is deposited using other silicon source agent such as silane, disilane, dichlorosilane, hexachlorodisilane, silicon tetraiodide, silicon chloride, tetrakis(dimethylamino)silane, bis(diethylamino)ethylsilane, tris(isopropylamino)silane, tris(dimethylamino)silane, mono-methyl hydrazine, and hydrazino silanes. The nitridation source gas could also be hydrazine ($N_2H_4$). In one embodiment, the precursor agents include BTBAS and $NH_3$ at a ratio greater than 0 ($NH_3$:BTBAS) and less than 100.

In one embodiment, the process temperature for each layer of the multilayer nitride etch stop stack 19 using the BTBAS process ranges from about 550° C. to about 700° C. In another embodiment, the process temperature for each layer of the nitride etch stop layer 19 using for the silane process ranges from about 550° C. to about 675° C. In yet another embodiment, the process temperature for each layer of the nitride etch stop layer 19 using for the disilane process ranges from about 400° C. to about 700° C.

In one embodiment, each layer of the multilayer nitride etch stop stack 19 is formed using $NH_3$ and BTBAS with a ratio greater than 1 ($NH_3$:BTBAS), a process temperature of about 675° C. and a process pressure of about 140 Torr.

Figure 2:
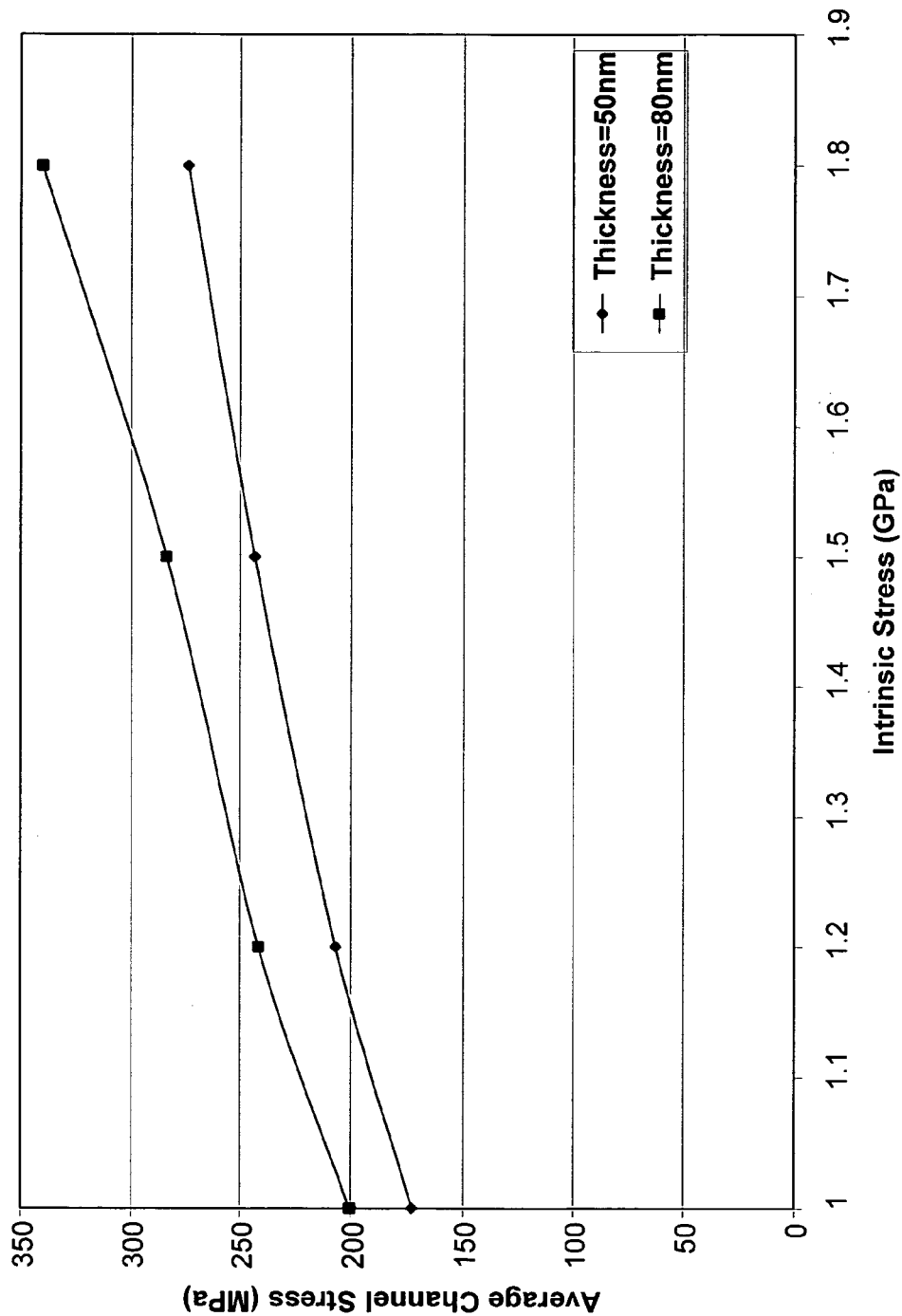
FIG. 2 illustrates, the effect of intrinsic film stress of inducing a tensile stress in a device channel region.

FIG. 2 illustrates that as the intrinsic stress in the nitride etch stop layer 17 increases the tensile stress induced in the substrate, e.g. the channel region 13. For instance, for a nitride etch stop layer 17 of a thickness of about 50 nm, as the intrinsic stress formed in the layer increases from about 1 to 1.8 GPa, the average stress induced in the channel region 13 increases from about 175 MPa to about 250 MPa. For another instance, for a nitride etch stop layer 17 of a thickness of about 80 nm, as the intrinsic stress formed in the film increases from about 1 to 1.8 GPa, the average stress induced in the channel region 13 increases from about 200 MPa to about 340 MPa. Thus, increasing intrinsic stress in the nitride etch stop layer 17 increases the tensile stress in the channel region 13 at a steady rate.

Figure 3:
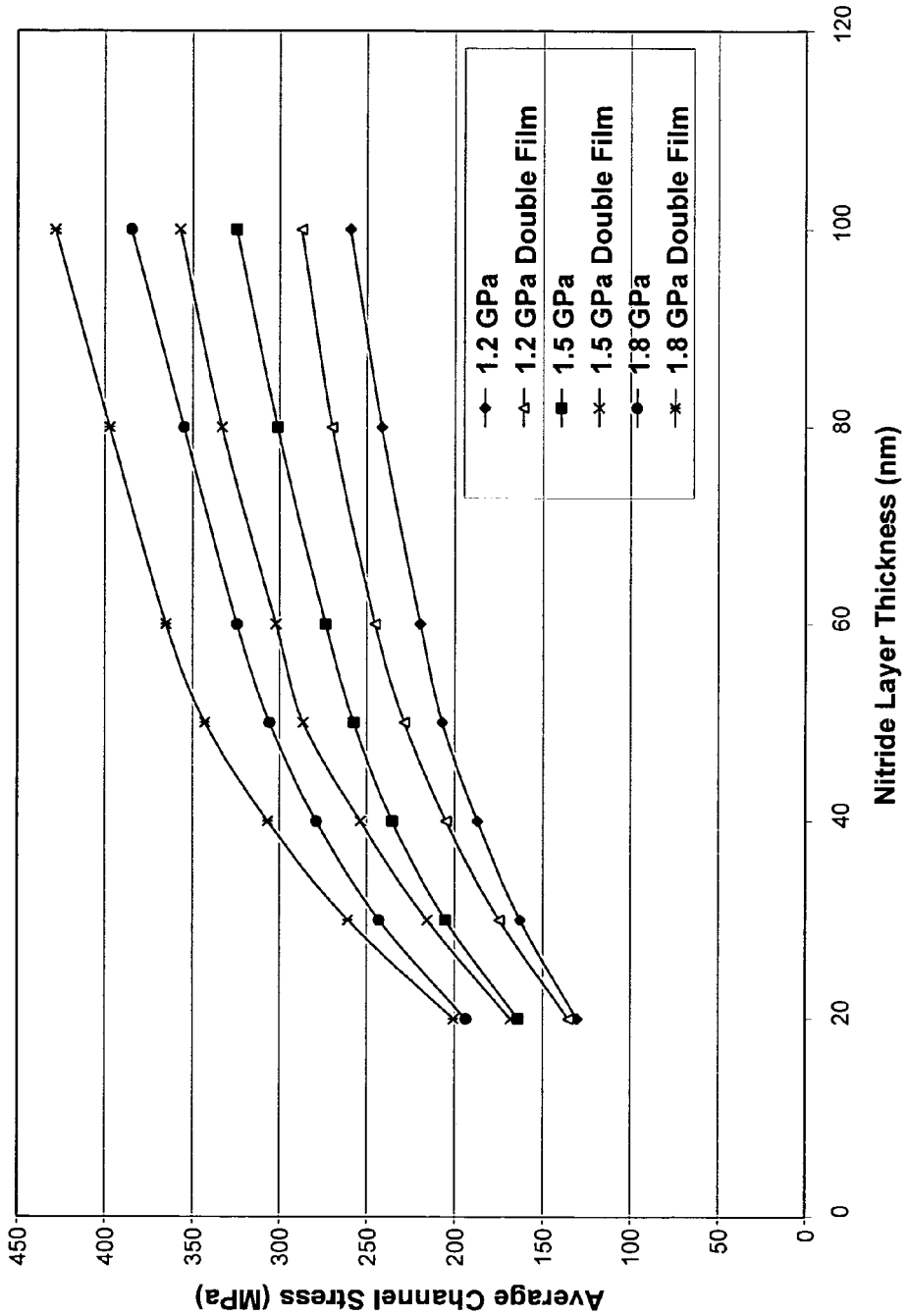
FIG. 3 illustrates the effect of film thickness of the nitride etch stop layer on inducing a tensile stress in the device channel region.

FIG. 3 illustrates that increasing the thickness in the nitride etch stop layer 17 increases stress in the channel region 13. As shown in FIG. 3, as the thickness of the nitride etch stop layer 17 increases from about 20 nm to about 100 nm for the nitride etch stop layer 17 having an intrinsic stress value of about 1.2 GPa, the average stress formed in the channel region increases from about 125 MPa to 260 MPa. Alternatively, as the thickness of the nitride etch stop layer 17 increases from about 20 nm to about 100 nm for the nitride etch stop layer 17 having an intrinsic stress value of about 1.5 GPa, the average stress formed in the channel region increases from about 160 MPa to 325 MPa. Alternatively, as the thickness of the nitride etch stop layer 17 increases from about 20 nm to about 100 nm for the nitride etch stop layer 17 having an intrinsic stress value of about 1.8 GPa, the average stress formed in the channel region increases from about 200 MPa to 380 MPa. Thus, tailoring the thickness of the nitride etch stop layer 17 allows for tailoring of the average tensile stress induced in the channel region 13.

Additionally, FIG. 3 also illustrates that forming a multilayer nitride etch stop stack such as the multilayer nitride etch stop stack 19 increases the tensile stress formed in the channel region 13 (as compared to a single nitride etch stop layer 17). For a particular thickness, when the nitride etch stop layer is a multilayer (e.g., the multilayer nitride stack 19 or a dual nitride stack) as opposed to a single layer of the same particular thickness, (e.g., the nitride etch stop layer 17), the tensile stress formed in the channel region 13 is substantially higher (e.g., about 20% higher) for the multilayer nitride layer. Thus, to increase the value of tensile stress in the channel region without unnecessarily increasing the thickness of the film, the nitride etch stop layer is formed as a multilayer nitride etch stop stack 19. For instance, as shown in FIG. 3, the multilayer nitride etch stop stack 19 with two nitride etch stop layers formed on top of one another and with an intrinsic value of 1.2 GPa, 1.5 GPa, or 1.8 GPa, the average tensile stress induced in the channel region 13 is higher for the multilayer nitride layer.

Figure 4:
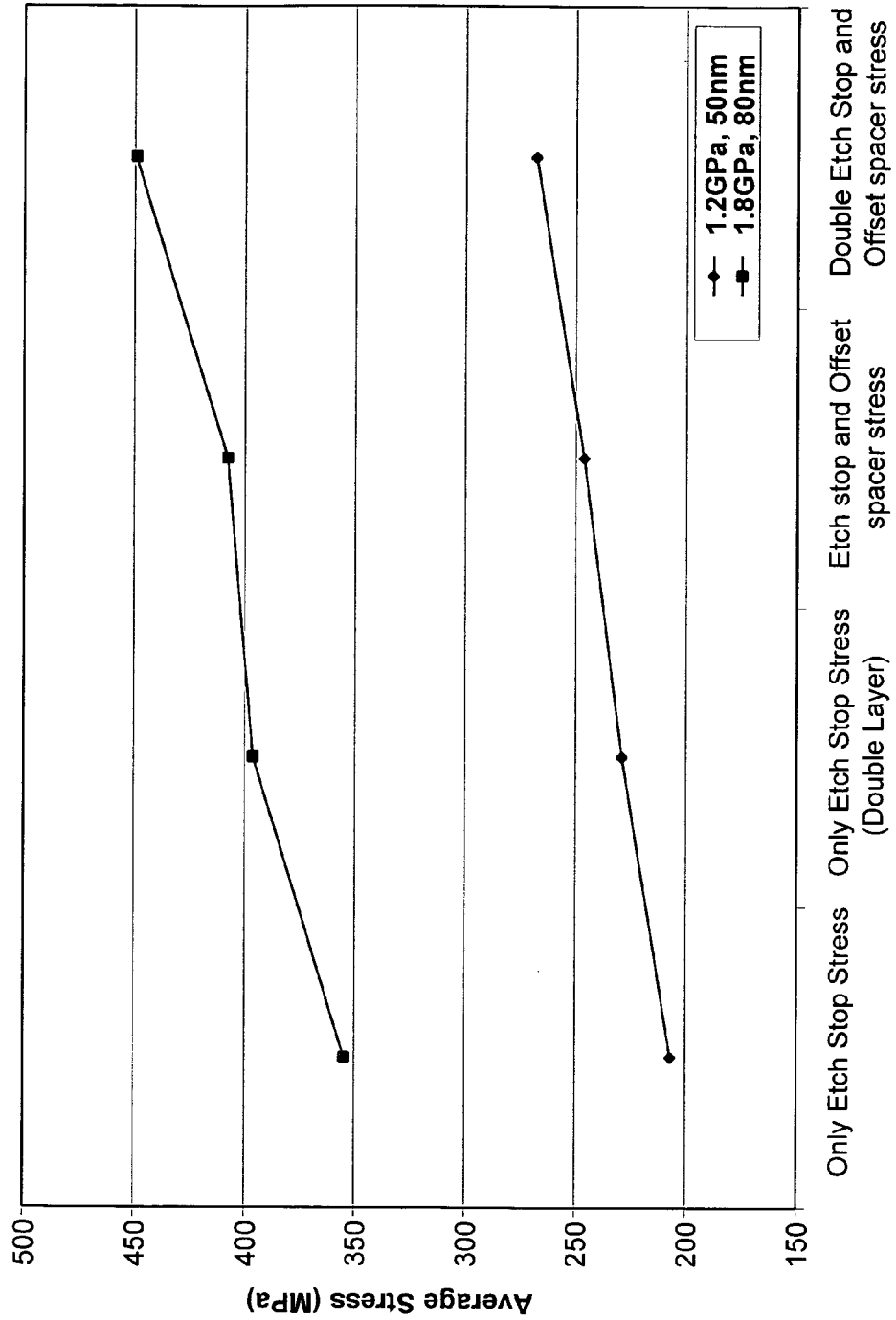
FIG. 4 illustrates the effect of spacer stress on inducing a tensile stress in the device channel region.

In one embodiment, the spacers 14 are made of nitride using the same deposition process as those used to make the nitride etch stop layer 17 or the multilayer nitride etch stop stack 19. Making the spacers 14 out of nitride also induces stress in the channel region 13. FIG. 4 illustrates that making the spacers 14 out of nitride improves the amount of tensile stress induced into the substrate. In one embodiment, the nitride spacers 14 are deposited over the underlying film, e.g., over the substrate 12 having the source and drain regions 15 and 16 formed therein, and the gate dielectric layer 18 and the gate electrode 10 formed thereon. In one embodiment, the substrate 12 is thermally shocked as previously described prior to the deposition or formation of the nitride spacers 14. In one embodiment, after the nitride spacers 14 are formed, a nitride etch stop layer (e.g., similar to the nitride etch stop layer 17) or a multilayer nitride etch stop stack (e.g., similar to the multilayer nitride etch stop stack 19) is formed over the substrate and the nitride spacers 14.

As illustrated in FIG. 4, the average stress formed in the channel region 13 is lowest when only the nitride etch stop layer 17 is formed over the substrate 12 (e.g., about 205 MPa). The average stress formed in the channel region 13 is improved when the multilayer nitride etch stop stack 19 is formed over the substrate 12 (e.g., about 235 MPa). The average stress formed in the channel region 13 is improved even more when the spacers 14 are made of nitride in addition to having the nitride etch stop layer 17 formed over the substrate 12 (e.g., about 250 MPa). The average stress formed in the channel region 13 is improved the highest when the spacers 14 are made of nitride in addition to having the multilayer nitride etch stop stack formed over the substrate 12 (e.g., about 270 MPa).

Similarly, as illustrated in FIG. 4, the average stress formed in the channel region 13 is lowest when only the nitride etch stop layer 17 is formed over the substrate 12 (e.g., about 350 MPa for a nitride etch stop layer 17 with 1.8 GPa intrinsic stress and 80 nm thickness). The average stress formed in the channel region 13 is improved when the multilayer nitride etch stop stack 19 is formed over the substrate 12 (e.g., about 400 MPa). The average stress formed in the channel region 13 is improved even more when the spacers 14 are made of lowest intrinsic stress (tensile) nitride in addition to having the nitride etch stop layer 17 formed over the substrate 12 (e.g., about 410 MPa). The average stress formed in the channel region 13 is improved the highest when the spacers 14 are made of lowest intrinsic stress (tensile) nitride in addition to having the multilayer nitride etch stop stack formed over the substrate 12 (e.g., about 450 MPa). Thus, to tailor the tensile stress in the channel region 13, the spacers 14 can be made out of lowest intrinsic stress (tensile) nitride to increase the channel stress without the need to make the nitride etch stop layer on the substrate 12 thicker than necessary.

Additionally, the tensile stress in the channel region 13 can be tailored. For instance, a nitride etch stop layer 17 previously described can be formed over the substrate 12; a multilayer nitride etch stop stack 19 previously described can be formed over the substrate 12; and the spacers 14 can be made of nitride. Any one of a combination of more than one can be done to tailor the stress in the channel region 13. Using these methods, the nitride etch stop layer formed over a substrate does not need to be too thick to increase the stress in the channel region 13.

In some embodiments, dopants are added to any one or more of the nitride etch stop layer, the multilayer nitride etch stop stack, and the nitride spacers to tailor the channel stress in the substrate. Each of the nitride etch stop layer, the multilayer nitride etch stop stack, and the nitride spacers can be modulated by adding a dopant or dopants to the deposition process of a particular film, stack, or spacer. In some embodiments, dopants such as hydrogen ($H_2$), germane ($GeH_4$), and nitrous oxide ($N_2O$) are added to the deposition process to modulate the nitride etch stop layer, the multilayer nitride etch stop stack, and/or the nitride spacers. These dopants can increase ($GeH_4$, for example) or decrease ($N_2O$, for example) the channel stress in the substrate by modulating the silicon nitride amorphous film structure. Additionally, adding the dopants to any of these films, stacks, or spacers also can increase or decrease their deposition rate. For example, to increase the deposition rate of any of these films, stacks, or spacers, $H_2$ or $GeH_4$ can be added to the deposition process.

Figure 5:
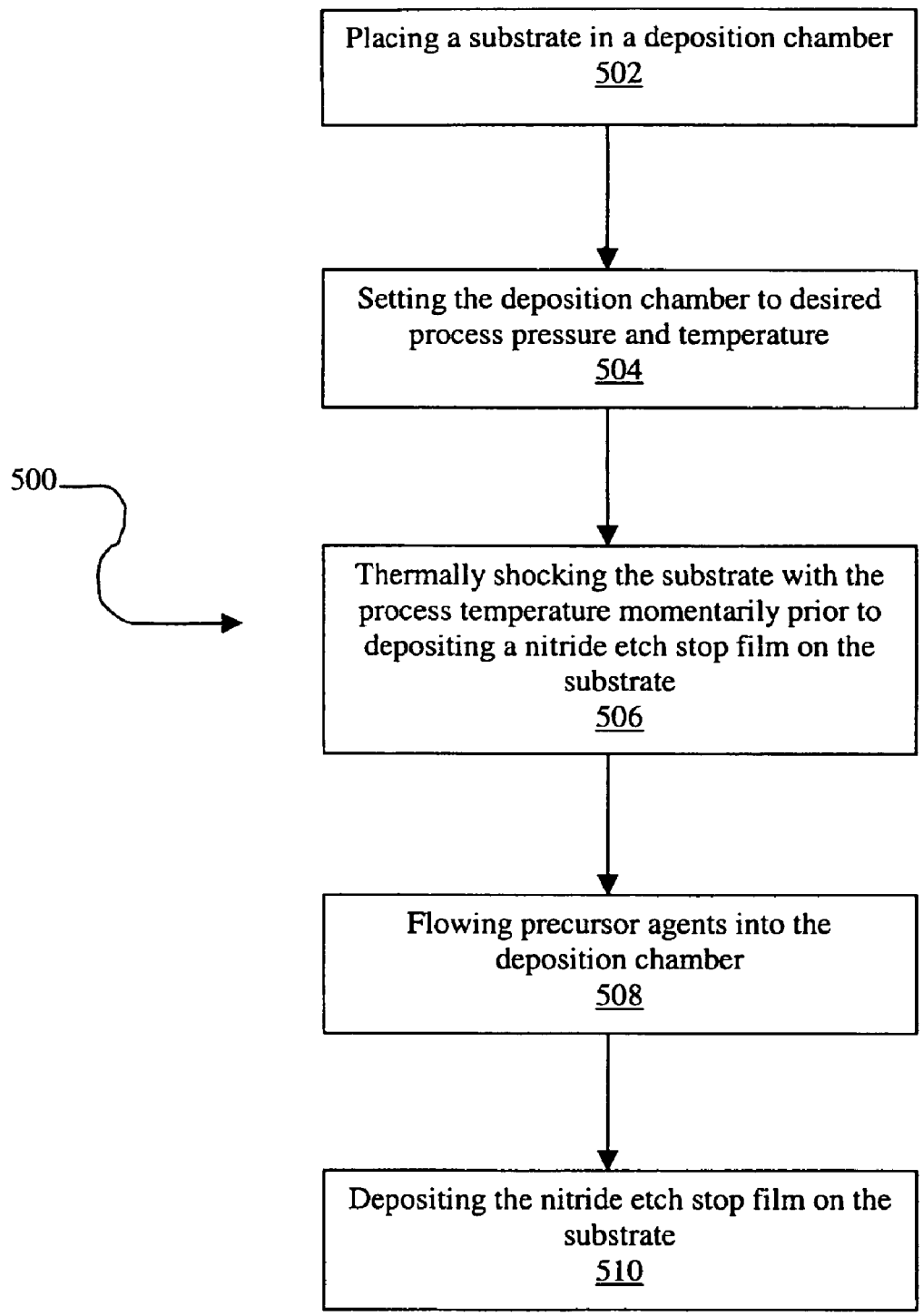
FIG. 5 illustrates an exemplary method of a forming a nitride etch stop layer.

FIG. 5 illustrates an exemplary method 500 of depositing a nitride etch stop layer previously described. In one embodiment, at box 502, a substrate is placed in a deposition chamber. The substrate may have at least one semiconductor device (e.g., a transistor, capacitor, or resistor) or other structures formed on top of the substrate as previously described. In one embodiment, the deposition chamber is a single wafer deposition chamber described in embodiments below. At box 504, the deposition chamber is set to desired process pressure and temperature. In one embodiment, the process temperature ranges from about 550° C. to about 700° C. In another embodiment, the process temperature is about 675° C. In yet another embodiment, the process temperature ranges from about 400° C. to about 700° C. In one embodiment, the process pressure can be a pressure that put the deposition chamber into a low-pressure deposition chamber, for instance, a pressure below 760 Torr. In one embodiment, the process pressure is about 50-500 Torr. In yet another embodiment, the process pressure is about 140 Torr.

At box 506, the substrate is thermally shocked with the process temperature momentarily or just immediately prior to depositing a nitride etch stop film on the substrate. In one embodiment, the substrate is maintained substantially cooler than the process temperature until just immediately prior to the deposition of the nitride etch stop layer. For instance, the deposition chamber may have a heater upon which the substrate sits for the deposition of the nitride etch stop film. In that example, the substrate may be lowered on top of the heater of the deposition chamber just prior to the deposition. Alternatively, the heaters of the deposition chamber is set cooler until the deposition time. In another instance, the deposition chamber may have heat lamps or other suitable heating devices that can quickly heat up the deposition chamber. In this example, the heat lamps or devices may be turned on just prior to the deposition to thermally shock the substrate.

At box 508, precursor agents are flown into the deposition chamber. The precursor agents include a silicon source gas and a nitridation source gas. In one embodiment, the silicon source gas is BTBAS and the nitridation source gas is $NH_3$. In another embodiment, the silicon source gas is any one of silane, disilane, dichlorosilane, hexachlorodisilane, silicon tetraiodide, silicon chloride, tetrakis(dimethylamino)silane, bis(diethylamino)ethylsilane, tris(isopropylamino)silane, tris(dimethylamino)silane, mono-methyl hydrazine, and hydrazino silanes. In another embodiment, the nitridation source gas is $N_2H_4$. In one embodiment, the precursor agents include BTBAS and $NH_3$ at a ratio greater than 0 ($NH_3$: BTBAS) and less than 100. The precursor agents may be diverted from the deposition chamber prior to the deposition and prior to the substrate being thermally shocked in order for the flow rates of the precursors to stabilize. After the substrate is thermally shocked, (or almost immediately after the substrate is thermally shocked), the precursor agents are directed into the deposition chamber at their stabilized flow rate (and desired flow rates) for the deposition of the film.

At box 510, the nitride etch stop film is formed on the substrate. The deposition is allowed to continue for a sufficient amount of time to form a film of about 200-1000 angstroms.

Figure 6:
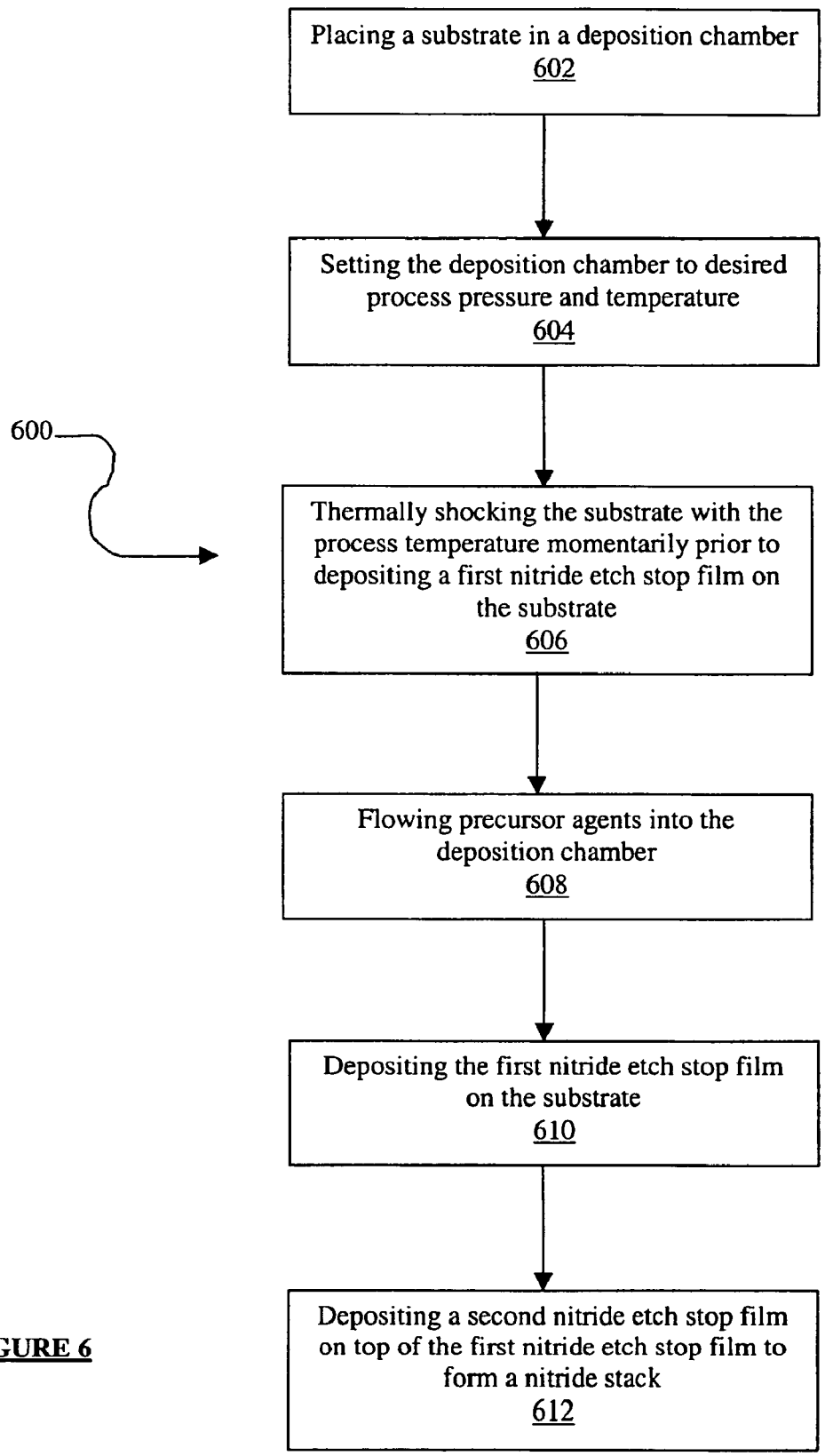
FIG. 6 illustrates an exemplary method of forming a multilayer nitride stack on a substrate.

FIG. 6 illustrates an exemplary method 600 of depositing a multilayer nitride stack as previously described. In one embodiment, at box 602, a substrate is placed in a deposition chamber. The substrate may have at least one semiconductor device (e.g., a transistor, capacitor, or resistor) or other structures formed on top of the substrate as previously described. In one embodiment, the deposition chamber is a single wafer deposition chamber described in embodiments below. At box 604, the deposition chamber is set to desired process pressure and temperature. In one embodiment, the process temperature ranges from about 550° C. to about 700° C. In another embodiment, the process temperature is about 675° C. In yet another embodiment, the process temperature ranges from about 400° C. to about 700° C. In one embodiment, the process pressure can be a pressure that put the deposition chamber into a low-pressure deposition chamber, for instance, a pressure below 760 Torr. In one embodiment, the process pressure is about 50-500 Torr. In yet another embodiment, the process pressure is about 140 Torr.

At box 606, the substrate is thermally shocked with the process temperature momentarily or just immediately prior to depositing a nitride etch stop film on the substrate. In one embodiment, the substrate is maintained substantially cooler than the process temperature until just immediately prior to the deposition of the nitride etch stop layer. The substrate may be lowered on top of the heater of the deposition chamber just prior to the deposition or alternatively the heaters of the deposition chamber is set cooler until the deposition time similar to previously discussed.

At box 608, precursor agents are flown into the deposition chamber. The precursor agents include a silicon source gas and a nitridation source gas. In one embodiment, the silicon source gas is BTBAS and the nitridation source gas is $NH_3$. In another embodiment, the silicon source gas is any one of silane, disilane, dichlorosilane, hexachlorodisilane, silicon tetraiodide, silicon chloride, tetrakis(dimethylamino)silane, bis(diethylamino)ethylsilane, tris(isopropylamino)silane, tris(dimethylamino)silane, mono-methyl hydrazine, and hydrazino silanes. In one embodiment. In another embodiment, the nitridation source gas is $N_2H_4$. In one embodiment, the precursor agents include BTBAS and $NH_3$ at a ratio greater than 0 ($NH_3$:BTBAS) and less than 100. The precursor agents may be diverted from the deposition chamber prior to the deposition and prior to the substrate being thermally shocked in order for the flow rates of the precursors to stabilize. After the substrate is thermally shocked, (or almost immediately after the substrate is thermally shocked), the precursor agents are directed into the deposition chamber at their stabilized flow rate (and desired flow rates) for the deposition of the film.

At box 610, a first nitride etch stop film is formed on the substrate. In one embodiment, the deposition is allowed to continue for a sufficient amount of time to form a film of about 100-800 angstroms. The substrate is then allowed to cool. In one embodiment, the substrate having formed thereon the first nitride etch stop film is removed from the deposition chamber prior to the deposition of the second nitride etch stop film.

In one embodiment, the substrate, after being allowed to cool down, is moved back into the deposition chamber for the deposition of the second nitride etch stop film. At box 612, a second nitride etch stop film is formed on top of the first nitride etch stop film to form the multilayer nitride etch stop stack. The substrate may (but need not be) be thermally shocked similar to previous described prior to depositing the second nitride etch stop layer. In another embodiment, the substrate is not moved out of the deposition chamber after the deposition of the first nitride etch stop film. This is accomplished by moving the substrate away from the heater or heating device, or turning off the heating lamps. The substrate is allowed to cool down; the deposition chamber is set to the process temperature again for the deposition of the second nitride etch stop film; and the substrate is moved back to the heater or lamps turned on. In one embodiment, the deposition is allowed to continue for a sufficient amount of time to form the second film of about 100-800 angstroms.

In one embodiment, the total thickness of the multilayer nitride etch stop stack is about 200-1000 angstroms wherein each layer of the multilayer nitride etch stop stack is substantially equal in thickness to another layer. The thickness of one layer may however be substantially different for another layer depending on application.

Figure 7:
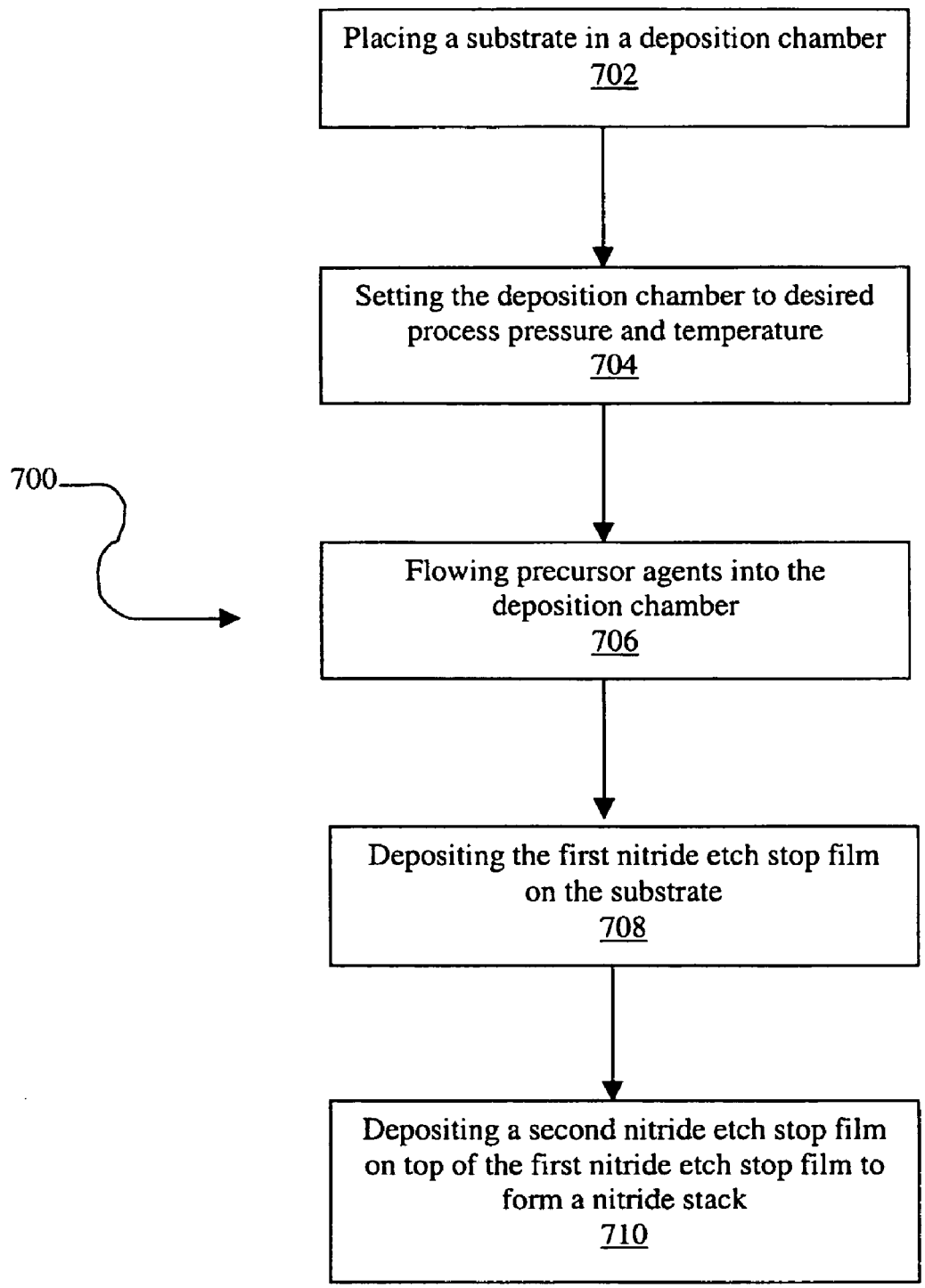
FIG. 7 illustrates another exemplary method of forming a multilayer nitride stack on a substrate.

FIG. 7 illustrates an exemplary method 700 of depositing a multilayer nitride stack as previously described. In one embodiment, at box 702, a substrate is placed in a deposition chamber. The substrate may have at least one semiconductor device (e.g., a transistor, capacitor, or resistor) or other structures formed on top of the substrate as previously described. In one embodiment, the deposition chamber is a single wafer deposition chamber described in embodiments below. At box 704, the deposition chamber is set to desired process pressure and temperature. In one embodiment, the process temperature ranges from about 550° C. to about 700° C. In another embodiment, the process temperature is about 675° C. In yet another embodiment, the process temperature ranges from about 400° C. to about 700° C. In one embodiment, the process pressure can be a pressure that put the deposition chamber into a low-pressure deposition chamber, for instance, a pressure below 760 Torr. In one embodiment, the process pressure is about 50-500 Torr. In yet another embodiment, the process pressure is about 140 Torr.

At box 706, precursor agents are flown into the deposition chamber. The precursor agents include a silicon source gas and a nitridation source gas. In one embodiment, the silicon source gas is BTBAS and the nitridation source gas is $NH_3$. In another embodiment, the silicon source gas is any one of silane, disilane, dichlorosilane, hexachlorodisilane, silicon tetraiodide, silicon chloride, tetrakis(dimethylamino)silane, bis(diethylamino)ethylsilane, tris(isopropylamino)silane, tris(dimethylamino)silane, mono-methyl hydrazine, and hydrazino silanes. In another embodiment, the nitridation source gas is $N_2H_4$. In one embodiment. In one embodiment, the precursor agents include BTBAS and $NH_3$ at a ratio greater than 0 ($NH_3$:BTBAS) and less than 100. The precursor agents may be diverted from the deposition chamber prior to the deposition and prior to the substrate being stabilized to the process temperature. After the substrate is stabilized, the precursor agents are directed into the deposition chamber at their stabilized flow rate (and desired flow rates) for the deposition of the film.

At box 708, a first nitride etch stop film is formed on the substrate. In one embodiment, the deposition is allowed to continue for a sufficient amount of time to form a film of about 100-800 angstroms. The substrate is then allowed to cool. At box 710, a second nitride etch stop film is formed on top of the first nitride etch stop film to form the multilayer nitride stack. In one embodiment, the deposition is allowed to continue for a sufficient amount of time to form a film of about 100-800 angstroms. In one embodiment, the substrate having formed thereon the first nitride etch stop film is removed from the deposition chamber prior to the deposition of the second nitride etch stop film. One difference between the method 700 and the method 600 is that the substrate is not thermally shocked prior to the deposition of any of the layer of the multilayer nitride etch stop stack.

Figure 8:
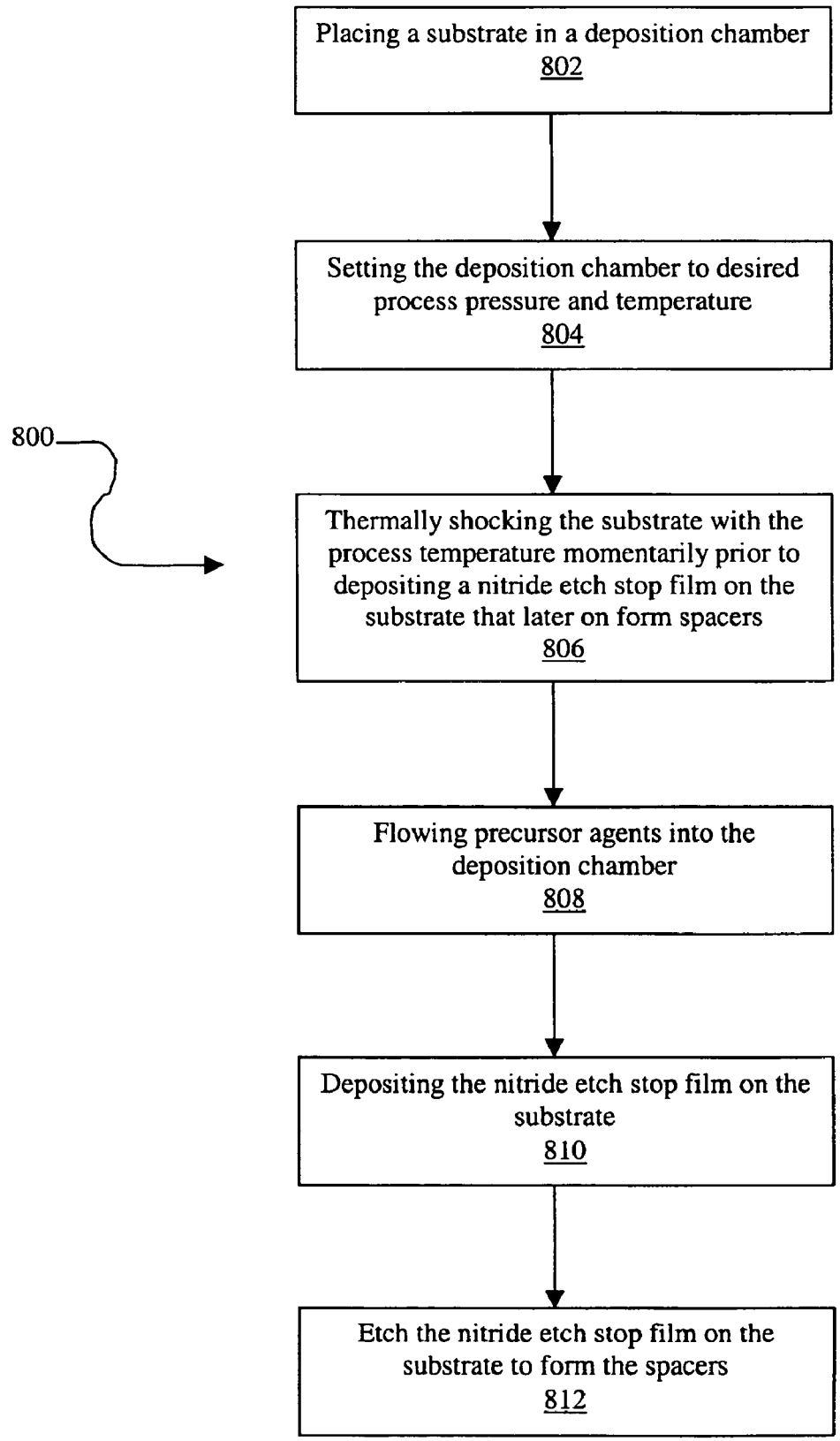
FIG. 8 illustrates an exemplary method of forming a nitride spacer on a substrate.

FIG. 8 illustrates an exemplary method 800 of depositing a nitride spacer as previously described. In one embodiment, at box 802, a substrate is placed in a deposition chamber. In one embodiment, the deposition chamber is a single wafer deposition chamber described in embodiments below. The substrate may have at least one semiconductor device (e.g., a transistor, capacitor, or resistor) or other structures formed on top of the substrate as previously described. In one embodiment, the substrate includes a source region, a drain region and a gate dielectric, and a gate electrode formed thereon. One spacer is then formed on each side of the gate dielectric and the gate electrode (similar to as shown in FIGS. 1A-1B). In one embodiment, a nitride film is first deposited over the entire surface of the substrate and the gate dielectric and the gate electrode. Then, etching is used to form the spacers.

At box 804, the deposition chamber is set to desired process pressure and temperature. In one embodiment, the process temperature ranges from about 550° C. to about 700° C. In another embodiment, the process temperature is about 675° C. In yet another embodiment, the process temperature ranges from about 400° C. to about 700° C. In one embodiment, the process pressure can be a pressure that put the deposition chamber into a low-pressure deposition chamber, for instance, a pressure below 760 Torr. In one embodiment, the process pressure is about 50-500 Torr. In yet another embodiment, the process pressure is about 140 Torr.

At box 806, the substrate is thermally shocked with the process temperature momentarily or just immediately prior to depositing a nitride spacer on the substrate. In one embodiment, the substrate is maintained substantially cooler than the process temperature until just immediately prior to the deposition of the nitride etch stop layer. For instance, the deposition chamber may have a heater upon which the substrate sits for the deposition of the nitride etch stop film. In that example, the substrate may be lowered on top of the heater of the deposition chamber just prior to the deposition. Alternatively, the heaters of the deposition chamber is set cooler until the deposition time. In another instance, the deposition chamber may have heat lamps or other suitable heating devices that can quickly heat up the deposition chamber. In this example, the heat lamps or devices may be turned on just prior to the deposition to thermally shock the substrate.

At box 808, precursor agents are flown into the deposition chamber. The precursor agents include a silicon source gas and a nitridation source gas. In one embodiment, the silicon source gas is BTBAS and the nitridation source gas is $NH_3$. In another embodiment, the silicon source gas is any one of silane, disilane, dichlorosilane, hexachlorodisilane, silicon tetraiodide, silicon chloride, tetrakis(dimethylamino)silane, bis(diethylamino)ethylsilane, tris(isopropylamino)silane, tris(dimethylamino)silane, mono-methyl hydrazine, and hydrazino silanes. In another embodiment, the nitridation source gas is $N_2H_4$. In one embodiment, the precursor agents include BTBAS and $NH_3$ at a ratio greater than 0 ($NH_3$:BTBAS) and less than 100. The precursor agents may be diverted from the deposition chamber prior to the deposition and prior to the substrate being thermally shocked in order for the flow rates of the precursors to stabilize. After the substrate is thermally shocked, (or almost immediately after the substrate is thermally shocked), the precursor agents are directed into the deposition chamber at their stabilized flow rate (and desired flow rates) for the deposition of the film that is used to form the spacers.

At box 810, the nitride etch stop film is formed on the substrate. The deposition is allowed to continue for a sufficient amount of time to form a film of about 200-1000 angstroms. At box 812, the nitride etch stop film is etched to form the spacers.

Figure 9:
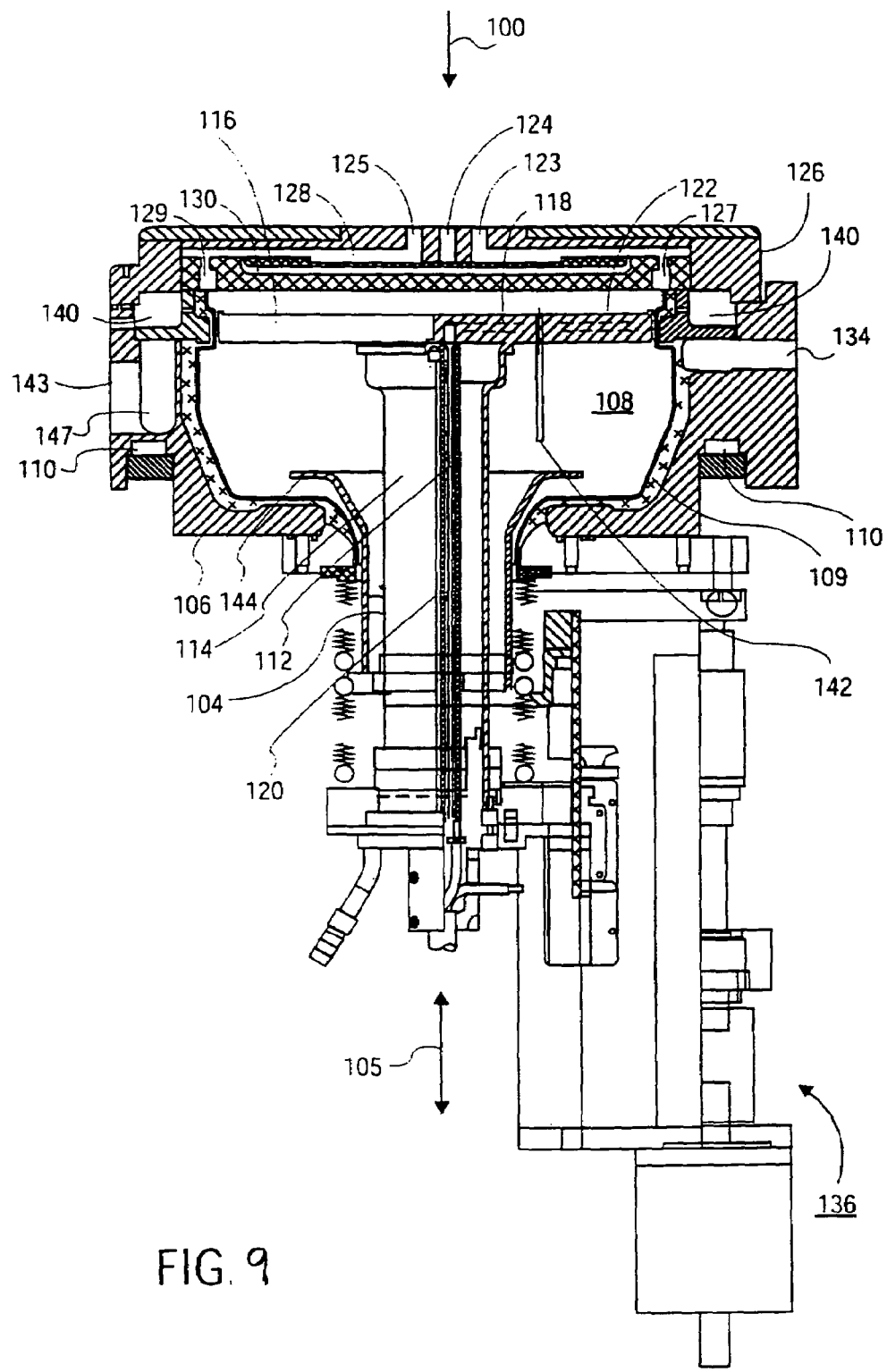
FIGS. 9-11 illustrate an exemplary embodiment of a single wafer deposition chamber that can be used for many embodiments of the present invention.

FIG. 9 illustrates a cross-sectional sideview of a single wafer chemical vapor deposition chamber that can be used to practice exemplary embodiments of the present invention. For the purpose of illustration, a chamber of approximately in the range of 5-6 liters is described and which can be used to carry out the exemplary embodiments of the present invention.

FIG. 9 illustrates that the reactor 100 comprises a chamber body 106 that defines a reaction chamber 108 in which process gases, precursor gases, or reactant gases are introduced to form a film (e.g., a silicon comprising film, a nitride etch stop film, or a dielectric film), on a substrate (not shown). The chamber body 106 is constructed of materials that will enable the chamber to sustain a pressure less than about 760 Torr. In one exemplary embodiment, the chamber body 106 is constructed of an aluminum alloy material. The chamber body 106 includes passages 110 for a temperature controlled fluid to be pumped therethrough to cool the chamber body 106. Equipped with the temperature controlled fluid passages, the reactor 100 is referred to as a "cold-wall" reactor. Cooling the chamber body 106 prevents corrosion to the material that is used to form the chamber body 106 due to the presence of the reactive species and the high temperature.

Figure 10:
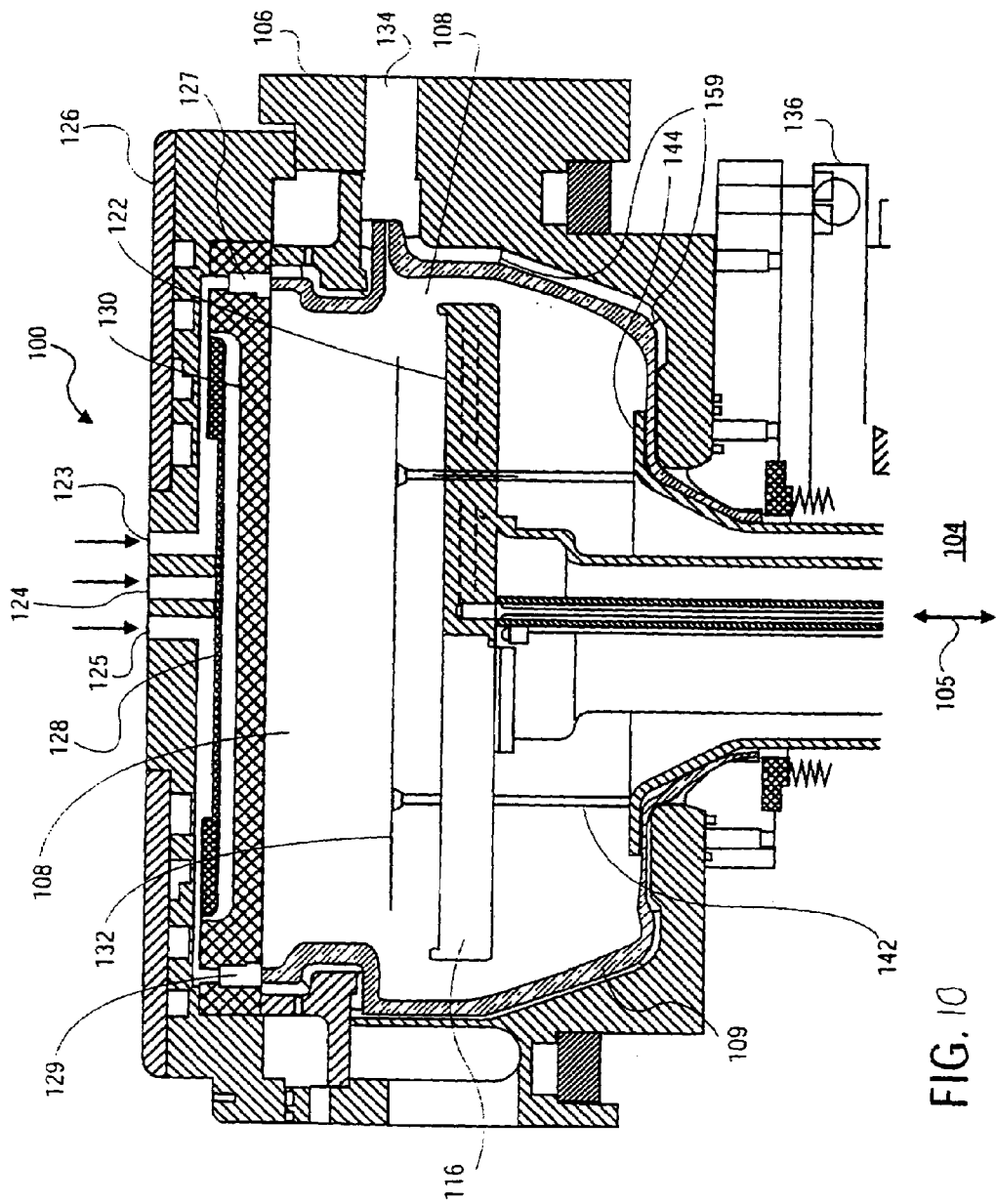

Resident in the chamber body 106 are a reaction chamber 108, a chamber lid 126, one or more distribution ports (e.g., ports 123, 124 and 125), a faceplate (or shower head) 130, a blocker plate 128, and a resistive heating assembly 104. The resistive heating assembly 104 includes several heating elements (rods) 112 running the length of a heater tube 114 that is made of nickel or other suitable heating elements. At the end of the heater tube 114 is a heating disk 116 made out of sintered aluminum nitride (AlN). Within the heating disk 116 is a spiral heating element (coil) 118 made out of molybdenum. The rods 112 and the coil 118 are joined by brazing and are electrically conductive therein. The rods 112 are thermally insulated with AlN ceramic sleeves 120. The coil 118 provides most of the electrical resistance and therefore most of the reaction chamber 108 heating. At the end of the heating disk 116 is a recess called a susceptor 122 and within the susceptor 122 is placed a wafer or a substrate such as the substrate 102 (FIG. 10).

FIG. 9 illustrates that the chamber body 108 further houses a lifter assembly 136. The lifter assembly 136 facilitates the moving of the wafer substrate in and out of the reaction chamber 108. The lifter assembly 136 can be a stepper motor. The lifter assembly 136 moves the heater assembly 104 up and down along an axis 105 to facilitate the moving of the wafer substrate in and out of the reaction chamber 108.

Figure 11:
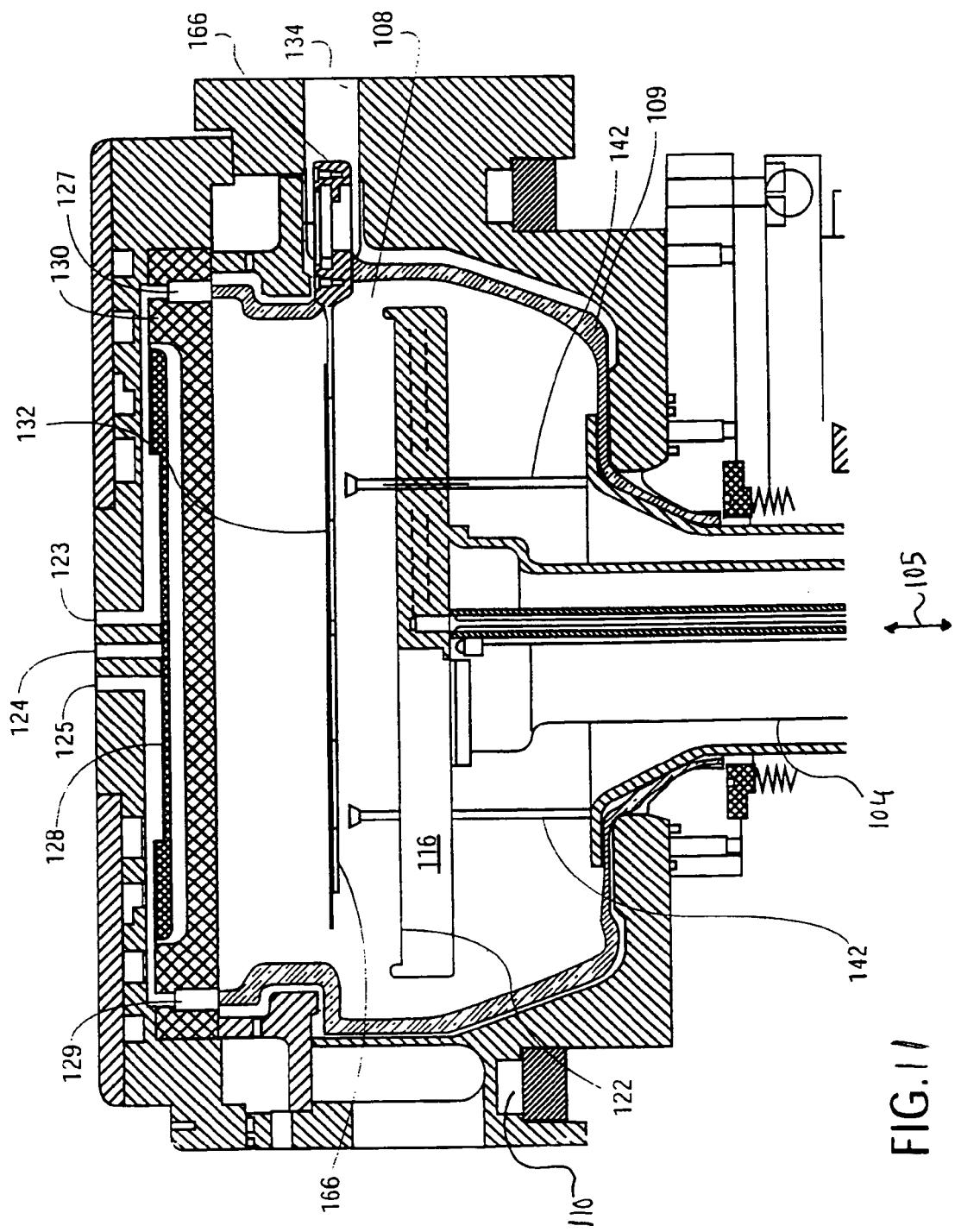

In one embodiment, FIG. 11 illustrates that a substrate 132 (the substrate 132 can be the substrate 102 in many embodiments) is placed into the reaction chamber 108 through the entry port 134 by for example, a robotic transfer mechanism (not shown). In one embodiment, the robotic transfer mechanism couples to a transfer blade 166 and the robotic transfer mechanism controls the transfer blade 166. The transfer blade 166 inserts the substrate 132 through the opening 134 to load the substrate 132 into the reaction chamber 108 within the susceptor 122. As the substrate 132 is being loaded, the lifter assembly 136 lowers the heater assembly 104 and the susceptor 122 in an inferior direction along the axis 105 so that the surface of the susceptor 122 is below the entry port 134. As the susceptor 122 is lowered, the substrate 132 is placed in the reaction chamber 108. Once the substrate 132 is loaded, the entry 134 is sealed and the lifter assembly 136 moves or advances the heater assembly 104 and the susceptor 122 in a superior (e.g., upward) direction toward the faceplate 130. In one exemplary embodiment, the advancement stops when the substrate 132 is a short distance (e.g., 400-900 mils) from the faceplate 130.

The chamber 108 also includes a contact lift plate 144, which has a set of lift pins 142 coupled thereto. The lift pins 142 hold the substrate 132 above the heating assembly 104 prior to the deposition and set the substrate 132 on the susceptor 122 for deposition.

The lift pins 142 are particularly useful when thermal shocking of the substrate 132 is required or desired. For instance, the heating assembly 104 may set the reaction chamber 108 to the process temperature. The lift pins 142 keep the substrate 132 cool until deposition for the film (e.g., the nitride etch stop film) is ready. Once deposition is ready to begin, the substrate 132 can be thermally shocked by having the susceptor moved up and having the lift pin 142 setting the substrate 132 down on the susceptor 122. In one embodiment, as the transfer blade 166 is inserted through the opening 134 with the substrate 132 above the blade 166, the lifter assembly 104 is moved inferiorly along the axis 105. Through the action of the lifter assembly 136, the lift pins 142 remain stationary extend above the top surface of the heating disk 116 (FIG. 10). The substrate 132 is placed in contact with the lift pins 142 and remained on the lift pins 142 until the deposition process begins. When deposition can begin, the lift assembly 136 moves the heating assembly 104 superiorly (upward) until it passes the lift pins 142 so that the substrate 132 is placed on the susceptor 122.

When the deposition is completed, the substrate 132 can be removed from the chamber 108 (for example, upon the completion of the deposition) first by being separated from the surface of the susceptor 122 as illustrated in FIGS. 10 and 11. The transfer blade 166 is inserted through the opening 134 beneath the heads of the lift pins 142, which support the substrate 132. The lift pins 142 are coupled to a contact lift plate 144 which can move the lift pins 142 up and down. Next, the lifter assembly 136 inferiorly moves (e.g., lowers) the heater assembly 104. As the heating assembly 104 moves in an inferior direction, through the action of the lifter assembly 136, the lift pins 142 remain stationary and ultimately, extend above the top surface of the heating disk 116 to separate the substrate 132 from the susceptor 122. The substrate 132 thus is put in contact with the transfer blade 166. The substrate 132 can then be removed through the entry port 134 by the transfer blade 166.

The mechanism described above may be repeated for subsequent substrates 132 or subsequent film deposition. A detailed description of one suitable lifter assembly 136 is described in U.S. Pat. No. 5,772,773, which is assigned to Applied Materials, Inc. of Santa Clara, Calif.

In one exemplary embodiment, when ready for deposition or processing, process agents (gases or liquids) or precursor agents controlled by a gas panel (not shown) are independently introduced into the reaction chamber 108 through the ports 123, 124, and 125. The blocker plate 128 has a plurality of holes (not shown) to accommodate a gas flow therethrough. In one embodiment, a gas is fed to the blocker plate 128 from one of the ports 123, 124, and 125, e.g., the port 124.

The reaction chamber 108 also includes a temperature indicator (not shown) to monitor the processing temperature inside the reaction chamber 108. In one example, the temperature indicator can be a thermocouple, which is positioned such that it conveniently provides data about the temperature at the surface of the susceptor 122 (or at the surface of a substrate 132 supported by the susceptor 122).

FIGS. 9-11 further illustrate that the reaction chamber 108 is lined with a temperature-controlled liner or an insulation liner 109. As mentioned above, the chamber body 106 includes the passages 110 for a temperature controlled fluid to create the cold-wall chamber effect. The reaction temperature inside reaction chamber 108 can be as high as 800° C. or even more. With the chemistry that is used to form the film in the reaction chamber 108, high temperature may easily corrode the chamber body 106 of the reaction chamber 108. Hence, in some embodiments, the chamber body 106 is equipped with the passages 110 for a temperature controlled fluid such as water or other coolant fluid that will cool the chamber body 106. This will prevent the chamber body 106 from getting too hot which will cause the chamber body 106 to be easily corroded. One problem that may associate with such a cold-wall chamber is that the areas inside the reaction chamber 108 that are in close proximity with the chamber's cold-wall tend to experience a sharp drop in temperature. The sharp drop in temperature in these areas encourages formation of condensation of particles that are undesirable or unfavorable for the deposition of certain films formed in the reaction chamber 108. For example, the reaction of HCD and NH3 in a deposition process to form a silicon nitride (Si3N4) film typically causes the formation of NH4Cl. NH4Cl is an undesirable salt by-product that requires cleaning to prevent contamination to the Si3N4 being formed. When the temperature drops below about 150° C., condensation such as NH4Cl will occur. These particles may become dislodged from the chamber wall. The dislodged particles form nucleation sites for particle formations on the wafer substrates. In one embodiment, the reaction chamber 108 is lined with the temperature-controlled line 109 to prevent the undesirable condensation of particles.

The temperature-controlled liner 109 helps maintain the temperature in the reaction chamber 108 at a certain level to prevent undesirable reaction due to the cold-wall effect of the chamber body 106. In one exemplary embodiment, the temperature-controlled liner 109 is a conduit through which a temperature-controlled fluid can be passed. In one embodiment, the temperature-controlled fluid must be able to maintain the temperature-controlled liner 109 at a temperature greater than 150° C., or alternatively, greater than 200° C. depending on the film forming application. In another embodiment, the temperature-controlled liner 109 is made out of a hard anodized aluminum that enables the temperature-controlled liner 109 to maintain a temperature greater than 150° C., or alternatively, greater than 200° C.

In one embodiment, the temperature-controlled liner 109 is coupled to the wall of the chamber body 106 such that the temperature-controlled liner 109 only has a few physical contacting points along the wall of the chamber body 106. (See for example, contacting points 159 illustrated in FIG. 10). Minimizing the physical contacts between the temperature-controlled liner 109 and the wall of the chamber body 106 minimizes heat loss to the chamber body 106 by minimizing conducting points.

In yet another embodiment, the temperature-controlled liner 109 is made out of a ceramic material of a type that can maintain a temperature greater than 150° C. or greater than 200° C. The temperature-controlled liner 109 can be made out of other suitable corrosion resistant materials. The hard anodized aluminum, the ceramic, or other suitable material that is used for the temperature-controlled liner 109 must be able to absorb the radiated heat from the heating assembly 104 and must not be too conductive so as to make the chamber body 106 hot by transferring the heat to the chamber body 106. In effect, the hard anodized aluminum, the ceramic, or other suitable material must insulate the heat and prevent it from being transferred to the cold wall of the chamber body 106.

Embodiments of the present invention can be used in conjunction with other methods of creating tensile stress and corresponding strain in a semiconductor substrate. For instance, a method of enhancing carrier mobility by creating a tensile stress and corresponding strain in silicon material includes forming a layer of silicon on a silicon germanium substrate. The silicon germanium lattice is generally more widely spaced than a pure silicon lattice as a result of the presence of the larger germanium atoms in the lattice. Because the atoms of the silicon lattice align with the more widely spread silicon germanium lattice, a tensile strain is created in the silicon layer. The silicon atoms are essentially pulled apart from one another. In conjunction with the silicon grown on a silicon germanium substrate, the substrate can be covered with the nitride etch stop layer formed with a thermal shocking technique according to some embodiments, the multilayer nitride etch stop stack according to some embodiments, or a combination thereof as previously discussed. The thickness of the nitride etch stop layer or the multilayer nitride etch stop stack layer can be controlled so that a particular tensile stress value can be obtained. Embodiments of the present invention thus can be used as a method of creating strain in a semiconductor substrate, alone or in combination with existing methods.

Figure 12:
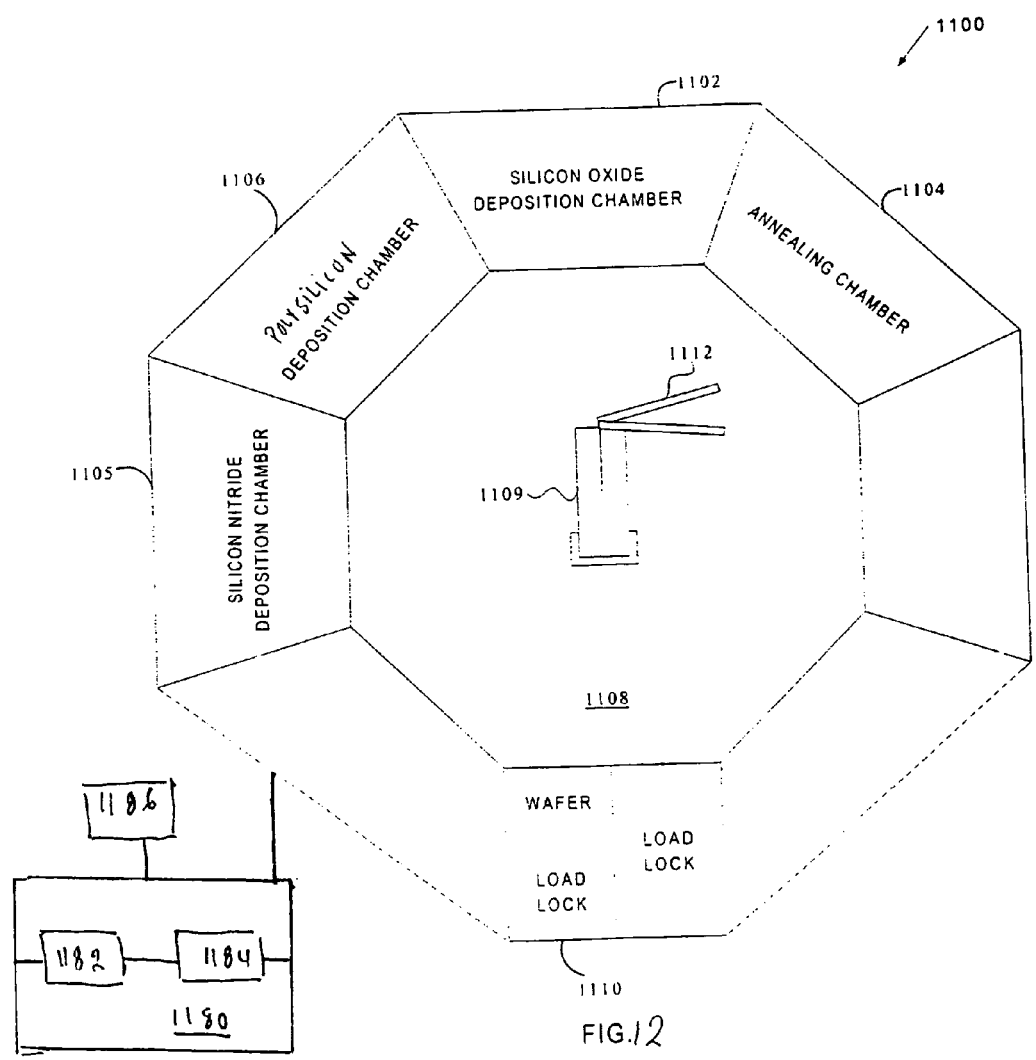
FIG. 12 illustrates exemplary cluster tool that can be used for many embodiments of the present invention.

Various films described in embodiments of the present invention can be formed in one chamber ("in situ") or in different chambers that are arranged into a cluster tool. FIG. 12 illustrates an exemplary cluster tool 1100 that includes several processing chambers. For example, the cluster tool 1100 includes a silicon oxide deposition chamber 1102, an annealing chamber 1104, a silicon nitride deposition chamber 1105, and a polysilicon deposition chamber 1106. Each of the silicon oxide deposition chamber 1102, the silicon nitride deposition chamber 1105, and the polysilicon deposition chamber 1106 can be a reaction chamber like the reactor 100 described above.

The cluster tool 1100 also includes a transfer chamber 1108 having a wafer handler 1109 (e.g., a robot), which includes a wafer clip 1112 for handling a wafer (or a substrate) that is to be deposited into one of the chambers mentioned above. The wafer clip 1112 can be the transfer blade 166 described above in FIG. 11. The transfer chamber 1108 is further coupled to a load lock system 1110, which stores the substrates to be processed. In one example, the wafer handler 1109 removes a substrate (e.g., a wafer) from the load lock system 1110 and places the substrate into an appropriate chamber depending on a process protocol. The wafer handler 1109 also removes the substrate from the chamber once the processing is complete and moves the substrate to the next processing chamber or into the load lock system 1110.

The transfer chamber 1108 is typically set at a reduced pressure as compared to the atmospheric condition. The transfer chamber 1108 can also be set at a pressure close to the process pressure that the chambers will be operating at. The cluster tool 1100 is also set at a pressure that once the wafers are in the load lock system 1110, the loading of other substrates into other chambers does not impact the operating conditions inside each chamber. When multiple processes are involved, for example, depositing the silicon oxide layer, depositing the silicon nitride layer, depositing the polysilicon layer, and then annealing the substrate, the wafer handler 1109 is used to move the substrate from one chamber to the next chamber for each process.

All of the multiple films can be formed using the cluster tool 1100 described above or can be formed "in situ" or in the same chamber (i.e., the reaction chamber 108). With either approach, in situ or using the cluster tool 1100, the films are not exposed to an oxidizing ambient or to contaminants before the deposition of one film upon another film thereby enabling a clean interface to be achieved between the films.

Figure 13:
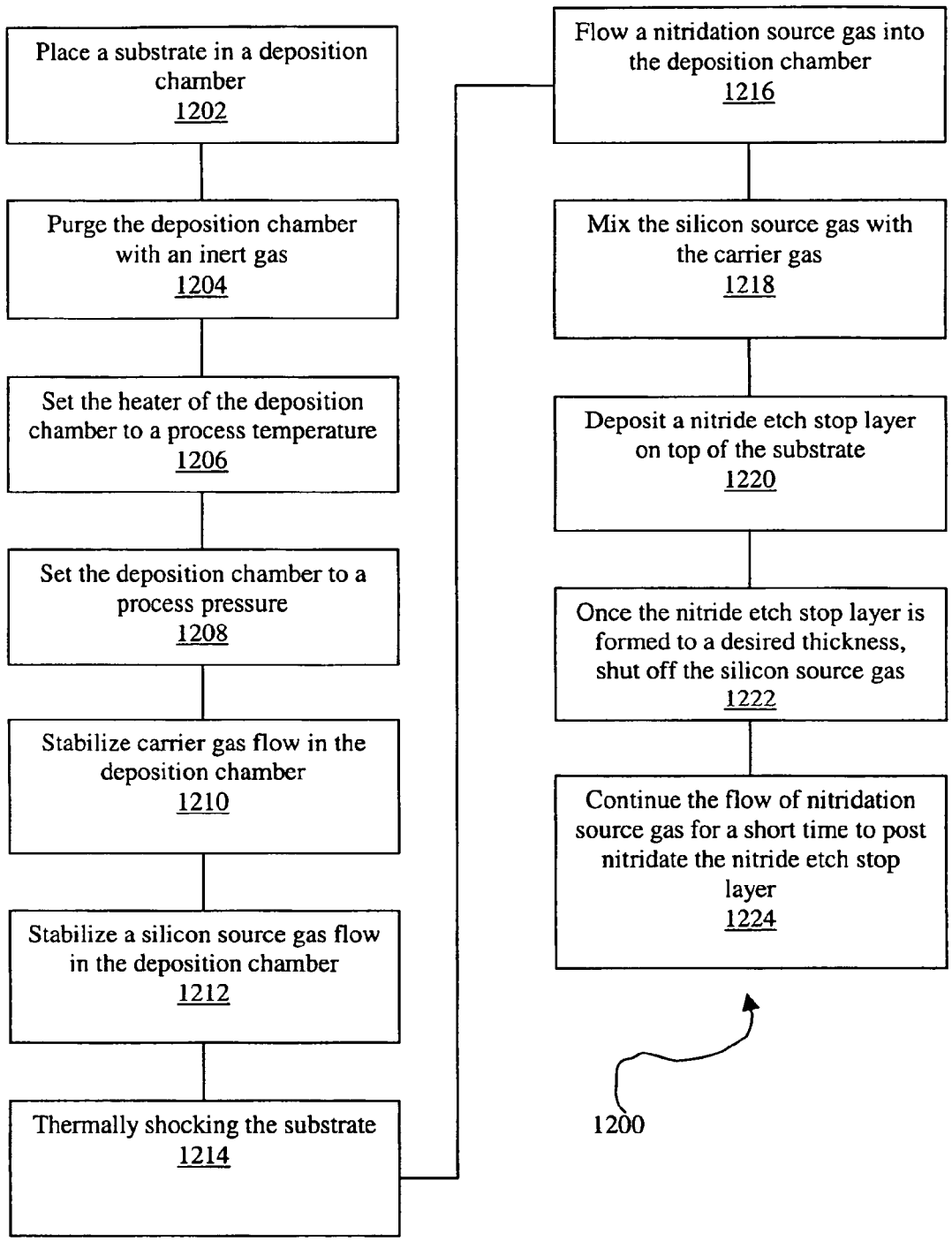
FIG. 13 illustrates an exemplary method of forming a nitride etch stop layer in accordance to embodiments of the present invention.

FIG. 13 illustrates an exemplary method 1200 of forming a nitride etch stop layer or a multilayer nitride layer in accordance with embodiments of the present invention. At box 1202, a substrate is placed in a deposition chamber. At this point, the substrate is place on a set of lift pins in the chamber and not allowed to sit on the heater in the deposition chamber. In one embodiment, the deposition chamber is a single wafer deposition chamber, reactor 100. At box 1204, the deposition chamber is purged with an inert gas. In one embodiment, the inert gas is nitrogen, helium, or argon. Purging provides a clean environment for the deposition. In one embodiment, purging is done by flowing the inert gas into the deposition chamber at about 2-8 SLM.

At box 1206, the heater in the deposition chamber is set to the desired process temperature (e.g., 400-700° C.). At box 1208, the deposition chamber is set to a desired process pressure (e.g., 50-300 Torr). In one embodiment, the inert gas flow is adjusted to allow the deposition chamber to reach the desired process pressure.

At box 1210, a carrier gas flow in the deposition chamber is stabilized. In one embodiment, the flow rate of the carrier gas is first set to the desired flow rate. The carrier gas is first flown so that it bypasses the deposition area of the deposition chamber. For example, the carrier gas is flown into the exhaust line of the deposition chamber until the flow rate is stabilized. At box 1212, a silicon source (e.g., BTBAS) flow in the deposition chamber is stabilized. In one embodiment, the silicon source is a liquid source. In one embodiment, the flow rate of the silicon source gas is first set to the desired flow rate. The silicon source is first flown so that it bypasses the deposition area of the deposition chamber. For example, the silicon source is flown into the exhaust line of the deposition chamber until the flow rate is stabilized.

At box 1214, the substrate is thermally shocked. In one embodiment, the heater of the deposition chamber is raised so that it is in contact or supporting the substrate. The substrate is then shocked with the process temperature or with the temperature of the heater just as the deposition is ready to begin.

At box 1216, a nitridation source gas (e.g., $NH_3$) is flown into the deposition chamber. Preflowing of the nitridation source gas prior to the deposition may pre-nitridate the surface of the substrate which may enhance the nucleation of the nitride etch stop layer to be deposited. The nitridation source gas is flown directly into the deposition chamber and needs not bypassing the chamber as in the case of the carrier gas and the silicon source. One reason for that is that the flow rates for the silicon source and the carrier gas need to be stabilized prior to being mixed and prior to the deposition which enhances the uniformity of the film being formed.

At box 1218, the silicon source are mixed with the carrier source gas. When ready for mixing the carrier gas and the silicon source are flown directly into the chamber after being mixed. At box 1220, the nitride etch stop is formed on top of the substrate. At box 1222, once the nitride etch stop layer is formed to a desired thickness, the silicon source is shut off. At box 1224, the flow of nitridation source gas is continued for a short time to post nitridate the nitride etch stop layer.

When forming multiple nitride etch stop layers one on top of each other, the substrate can be moved out of the deposition chamber and moved back in for the next layer. Alternatively, the substrate can be cooled, for example, lifted off the heater surface, and the silicon source diverted, until the substrate is ready for the next deposition. The same process of depositing the nitride etch stop layer can be repeated until all layers are deposited.

In some embodiments, the deposition chamber is coupled to a system controller (controller 1180), which controls all of the activities of the substrate processing system, e.g. cluster tool 1100 and the reactor 100. In an embodiment of the present invention the system controller 1180 includes a hard disk drive (memory 1182), a floppy disk drive and a processor 1184. The processor 1184 contains a single board computer (SBC), analog and digital input/output boards, interface boards and stepper motor controller board.

In one embodiment, the system controller 1180 executes system control software, which is a computer program stored in a computer-readable medium such as the memory 1182. Preferably, the memory 1182 is a hard disk drive, but the memory 1182 may also be other kinds of memory. The computer program includes sets of instructions that dictate the timing, mixture of gases, chamber pressure, chamber temperature, heating assembly, susceptor position, and other parameters of a particular process. Of course, other computer programs such as one stored on another memory device including, for example, a floppy disk or other another appropriate drive, may also be used to operate the controller 1180. An input/output device 1186 such as a monitor, a keyboard, and/or a mouse is used to interface between a user and the controller 1180. The system controller 1180 thus can execute instructions that perform the embodiments described herein.

In one embodiment, the sets of instructions are written so that a nitride etch stop layer or a multilayer nitride etch stop layer can be formed on the substrate. The instructions instruct placing a substrate in a single wafer deposition chamber and thermally shocking the substrate momentarily prior to the deposition of the nitride etch stop layer. The instructions instruct maintaining the substrate at a temperature that is substantially lower than a desired deposition temperature and shocking the substrate with the desired deposition temperature just momentarily prior to the nitride etch stop deposition. Alternatively, the instructions instruct maintaining the substrate at a distance above a heater of the single wafer deposition chamber before the deposition and allowing the substrate to contact the heater just momentarily prior to the nitride etch stop deposition to thermally shock the substrate. The instructions further instruct depositing the nitride etch stop layer over the substrate.

In an alternative embodiment, the instructions instruct depositing a first nitride etch stop layer over the substrate and a second nitride etch stop layer over the first nitride etch stop to form a multilayer nitride etch stop stack. The instructions further instruct thermally shocking the substrate prior to depositing the first nitride etch stop layer and alternatively, thermally shocking the substrate prior to depositing the second nitride etch stop layer. The instructions further instruct removing the substrate having the first nitride etch stop layer deposited thereon out of the single wafer deposition chamber and thermally shocking the substrate momentarily prior to depositing the second nitride etch stop layer on the first nitride etch stop layer.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

What is claimed is:

1. A method of making a semiconductor device comprising:
   providing a substrate;
   forming a semiconductor device on the substrate;
   forming a tensile stress inducing layer over the substrate, the tensile stress inducing layer including a nitride stack having multiple nitride layers formed on top of one another, wherein the multiple nitride layers have substantially similar thicknesses, the tensile stress inducing layer introduces tensile stress into a channel region in the substrate,
   wherein forming the multiple nitride layers comprises a first nitride etch stop layer and a second nitride etch stop layer and wherein forming the tensile stress inducing layer comprises thermally shocking the substrate momentarily prior to depositing the first nitride etch stop layer.

2. A method of claim 1 wherein the semiconductor device has a source region and a drain region and a gate stack formed therein and wherein the tensile stress inducing layer is formed over the source and drain regions and the gate stack.

3. A method of claim 2 further comprising:
   forming a silicide layer over semiconductor device prior to forming the tensile stress inducing layer over the substrate.

4. A method of claim 2 further comprising:
   creating contacts to the source region, the drain region, and the gate stack.

5. A method of claim 2 wherein the substrate is one of a silicon comprising substrate, a monocrystalline silicon substrate, a germanium silicon substrate, and silicon on insulator substrate.

6. A method of claim 2 wherein the tensile stress inducing layer introduces a tensile stress ranging between about 150 mega Pascal and about 450 mega Pascal into the substrate.

7. A method of claim 2 wherein the tensile stress inducing layer is formed in a single wafer deposition chamber.

8. A method of claim 2 wherein the tensile stress inducing layer is formed in immediately after the substrate is thermally shocked in a deposition chamber.

9. A method of making a semiconductor device comprising:
   placing a substrate in a single wafer deposition chamber and thermally shocking the substrate momentarily prior to deposition; and
   depositing a first nitride etch stop layer over the substrate, the first nitride etch stop layer induces a tensile stress in the substrate, wherein the substrate has a source region and a drain region and a gate stack formed thereon and wherein the first nitride etch stop layer is formed over the source and drain regions and the gate stack,
   wherein thermally shocking the substrate includes maintaining the substrate at a temperature that is substantially lower than a desired deposition temperature and shocking the substrate with the desired deposition temperature just momentarily prior to the deposition.

10. A method of claim 9 wherein thermally shocking the substrate includes maintaining the substrate at a distance above a heater of the single wafer deposition chamber before the deposition and allowing the substrate to contact the heater just momentarily prior to the deposition, the heater is set to heat the substrate to a desired deposition temperature.

11. A method of claim 9 wherein the substrate has a source region and a drain region and a gate stack formed thereon and wherein the tensile stress inducing layer is formed over the source and drain regions and the gate stack.

12. A method of claim 9 further comprising:
    forming a silicide layer over the source and drain regions and the gate stack prior to depositing the first nitride etch stop layer.

13. A method of claim 9 further comprising:
    depositing a second nitride etch stop layer over the first nitride etch stop, the second nitride etch stop layer and the first nitride etch stop forming a nitride stack that induces the tensile stress in the substrate.

14. A method of claim 13 wherein depositing a second nitride etch stop layer further comprising:
    removing the substrate having the first nitride etch stop layer deposited thereon out of the single wafer deposition chamber; and
    thermally shocking the substrate momentarily prior to depositing the second nitride etch stop layer.

15. A method of claim 14 wherein thermally shocking the substrate includes maintaining the substrate at a temperature that is substantially lower than a desired deposition temperature and shocking the substrate with the desired deposition temperature just momentarily prior to the deposition.

16. A method of claim 14 wherein thermally shocking the substrate includes maintaining the substrate at a distance above a heater of the single wafer deposition chamber before the deposition and allowing the substrate to contact the heater just momentarily prior to the deposition, the heater is set to heat the substrate to a desired deposition temperature.

17. A method of claim 9 further comprising:
    forming a silicide layer over the source and drain regions and the gate stack prior to depositing the first nitride etch stop layer.

18. A method of making a semiconductor device comprising:
    providing a substrate;
    forming a semiconductor device on the substrate;
    forming a tensile stress inducing layer over the substrate, the tensile stress inducing layer including a nitride stack having multiple nitride layers formed on top of one another, wherein at least one of the multiple nitride layers has a tensile stress, the tensile stress inducing layer introduces tensile stress into a channel region in the substrate
    wherein the tensile stress inducing layer is formed immediately after the substrate is thermally shocked in a deposition chamber, providing a gain in tensile stress in at least one of the multiple nitride layers.

19. A method of claim 18 wherein the semiconductor device has a source region and a drain region and a gate stack formed therein and wherein the tensile stress inducing layer is formed over the source and drain regions and the gate stack.

20. A method of claim 18 further comprising:
forming a silicide layer over semiconductor device prior to forming the tensile stress inducing layer over the substrate.

21. A method of claim 19 further comprising:
creating contacts to the source region, the drain region, and the gate stack.

22. A method of claim 18 wherein the substrate is one of a silicon comprising substrate, a monocrystalline silicon substrate, a germanium silicon substrate, and silicon on insulator substrate.

23. A method of claim 18 wherein the tensile stress inducing layer introduces a tensile stress ranging between about 150 mega Pascal and about 450 mega Pascal into the substrate.

24. A method of claim 18 wherein the tensile stress inducing layer is formed in a single wafer deposition chamber.

25. A method of making a semiconductor device comprising:
placing a substrate in a single wafer deposition chamber and thermally shocking the substrate momentarily prior to deposition; and
depositing a first nitride etch stop layer over the substrate, the first nitride etch stop layer induces a tensile stress in the substrate, wherein the substrate has a source region and a drain region and a gate stack formed thereon and wherein the first nitride etch stop layer is formed over the source and drain regions and the gate stack,
wherein thermally shocking the substrate includes maintaining the substrate at a distance above a heater of the single wafer deposition chamber before the deposition and allowing the substrate to contact the heater just momentarily prior to the deposition, the heater is set to heat the substrate to a desired deposition temperature.

26. The method of claim 25 wherein the substrate has a source region and a drain region and a gate stack formed thereon and wherein the tensile stress inducing layer is formed over the source and drain regions and the gate stack.

27. The method of claim 25 further comprising:
forming a silicide layer over the source and drain regions and the gate stack prior to depositing the first nitride etch stop layer.

28. A method of making a semiconductor device comprising:
placing a substrate in a single wafer deposition chamber and thermally shocking the substrate momentarily prior to deposition;
depositing a first nitride etch stop layer over the substrate, the first nitride etch stop layer induces a tensile stress in the substrate, wherein the substrate has a source region and a drain region and a gate stack formed thereon and wherein the first nitride etch stop layer is formed over the source and drain regions and the gate stack; and
depositing a second nitride etch stop layer over the first nitride etch stop, the second nitride etch stop layer and the first nitride etch stop forming a nitride stack that induces the tensile stress in the substrate, wherein depositing the second nitride etch stop layer further comprises:
removing the substrate having the first nitride etch stop layer deposited thereon out of the single wafer deposition chamber; and
thermally shocking the substrate momentarily prior to depositing the second nitride etch stop layer.

29. The method of claim 28 wherein thermally shocking the substrate includes maintaining the substrate at a temperature that is substantially lower than a desired deposition temperature and shocking the substrate with the desired deposition temperature just momentarily prior to the deposition.

30. The method of claim 28 wherein thermally shocking the substrate includes maintaining the substrate at a distance above a heater of the single wafer deposition chamber before the deposition and allowing the substrate to contact the heater just momentarily prior to the deposition, the heater is set to heat the substrate to a desired deposition temperature.

* * * * *